US010763778B2

(12) United States Patent
Janowski

(10) Patent No.: US 10,763,778 B2
(45) Date of Patent: *Sep. 1, 2020

(54) SOLAR WINDOW CONSTRUCTION AND METHODS

(71) Applicant: Brian Patrick Janowski, Marquette, MI (US)

(72) Inventor: Brian Patrick Janowski, Marquette, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/278,713

(22) Filed: Feb. 18, 2019

(65) Prior Publication Data

US 2019/0267933 A1 Aug. 29, 2019

Related U.S. Application Data

(63) Continuation-in-part of application No. 15/375,077, filed on Dec. 9, 2016, now Pat. No. 10,211,776.

(Continued)

(51) Int. Cl.

| *H02S 20/26* | (2014.01) |
| *E06B 7/28* | (2006.01) |
| *E06B 3/66* | (2006.01) |
| *E06B 3/67* | (2006.01) |
| *E06B 9/24* | (2006.01) |
| *G02F 1/163* | (2006.01) |

(Continued)

(52) U.S. Cl.
CPC ............... *H02S 20/26* (2014.12); *E06B 3/50* (2013.01); *E06B 3/66* (2013.01); *E06B 3/6722* (2013.01); *E06B 7/28* (2013.01); *E06B 9/24* (2013.01); *G02F 1/163* (2013.01); *H01L 31/02008* (2013.01); *H01L 51/00* (2013.01); *H02S 30/00* (2013.01); *H02S 30/10* (2014.12); *E06B 2009/2464* (2013.01)

(58) Field of Classification Search
CPC .......... H02S 20/26; H02S 40/38; H02S 20/30; E06B 9/24; E06B 2009/247; E06B 2009/2476; E06B 7/28; E06B 3/24; E06B 3/00; Y02B 10/10; H02J 7/355
See application file for complete search history.

(56) References Cited

U.S. PATENT DOCUMENTS

| 4,137,098 A * | 1/1979 | Field ........................ E06B 7/02 |
| | | 136/248 |
| 4,279,240 A * | 7/1981 | Artusy .................... E06B 7/086 |
| | | 126/579 |

(Continued)

*Primary Examiner* — Jessie T Fonseca
(74) *Attorney, Agent, or Firm* — Device Patent LLC

(57) ABSTRACT

Disclosed are novel forms of operable and fixed windows capable of at least one or more of: producing an electrical current utilizing a transparent or semi-transparent solar collecting coating or film on a pane, and selectively changing one or more of opacity and tint of one or more electrochromatic layers in the window. Some embodiments also disclose a robust scaffold assembly utilized to enclose the perimeter of the substrate and one or more transparent solar cells or electrochromatic layers, or transparent solar cells and electrochromatic layers. Various structural and electrical configurations are disclosed to satisfy the kinematic demands of operable windows. Wired and wireless configurations of the windows are contemplated as are self-powered versions whereby the transparent solar collector powers the electrochromatic function.

20 Claims, 20 Drawing Sheets

Related U.S. Application Data

(60) Provisional application No. 62/265,373, filed on Dec. 9, 2015.

(51) Int. Cl.
*E06B 3/50* (2006.01)
*H02S 30/00* (2014.01)
*H02S 30/10* (2014.01)
*H01L 31/02* (2006.01)
*H01L 51/00* (2006.01)

(56) References Cited

U.S. PATENT DOCUMENTS

| | | | | |
|---|---|---|---|---|
| 6,180,871 B1 * | 1/2001 | Campbell | H01L 31/068 | 136/245 |
| 7,834,265 B2 * | 11/2010 | Schmidt | H01L 31/02008 | 136/251 |
| 8,046,960 B1 * | 11/2011 | Kapany | F24S 20/63 | 52/171.3 |
| 8,215,787 B2 * | 7/2012 | Mathai | H01L 51/52 | 362/147 |
| 8,337,039 B1 * | 12/2012 | Larkin | F21V 33/006 | 136/244 |
| 2006/0191215 A1 * | 8/2006 | Stark | C03C 27/08 | 52/204.6 |
| 2008/0236654 A1 * | 10/2008 | Pietrangelo | E06B 3/68 | 136/251 |
| 2012/0031018 A1 * | 2/2012 | Kapany | H01L 31/02325 | 52/173.3 |
| 2013/0186768 A1 * | 7/2013 | Bulovic | C25B 1/003 | 205/340 |
| 2014/0020312 A1 * | 1/2014 | Seiling | H02S 40/38 | 52/173.3 |
| 2014/0130864 A1 * | 5/2014 | Lunt | E06B 3/66 | 136/259 |
| 2014/0166080 A1 * | 6/2014 | Aleksov | H01L 27/301 | 136/251 |
| 2014/0198371 A1 * | 7/2014 | Conklin | G02F 1/163 | 359/275 |
| 2014/0256081 A1 * | 9/2014 | Hammond | H01L 51/0026 | 438/82 |
| 2014/0330538 A1 * | 11/2014 | Conklin | F24S 50/80 | 702/189 |
| 2015/0020872 A1 * | 1/2015 | Park | H01L 31/0488 | 136/251 |
| 2015/0047697 A1 * | 2/2015 | Conklin | H01L 31/0468 | 136/256 |
| 2015/0083195 A1 * | 3/2015 | Gilbert | H01L 31/0525 | 136/248 |
| 2017/0070185 A1 * | 3/2017 | Ting | E06B 1/00 | |
| 2017/0130520 A1 * | 5/2017 | Cornelissen | H01L 31/042 | |
| 2017/0359016 A1 * | 12/2017 | Kim | H02S 20/26 | |
| 2018/0053869 A1 * | 2/2018 | Ko | H01L 31/054 | |

* cited by examiner

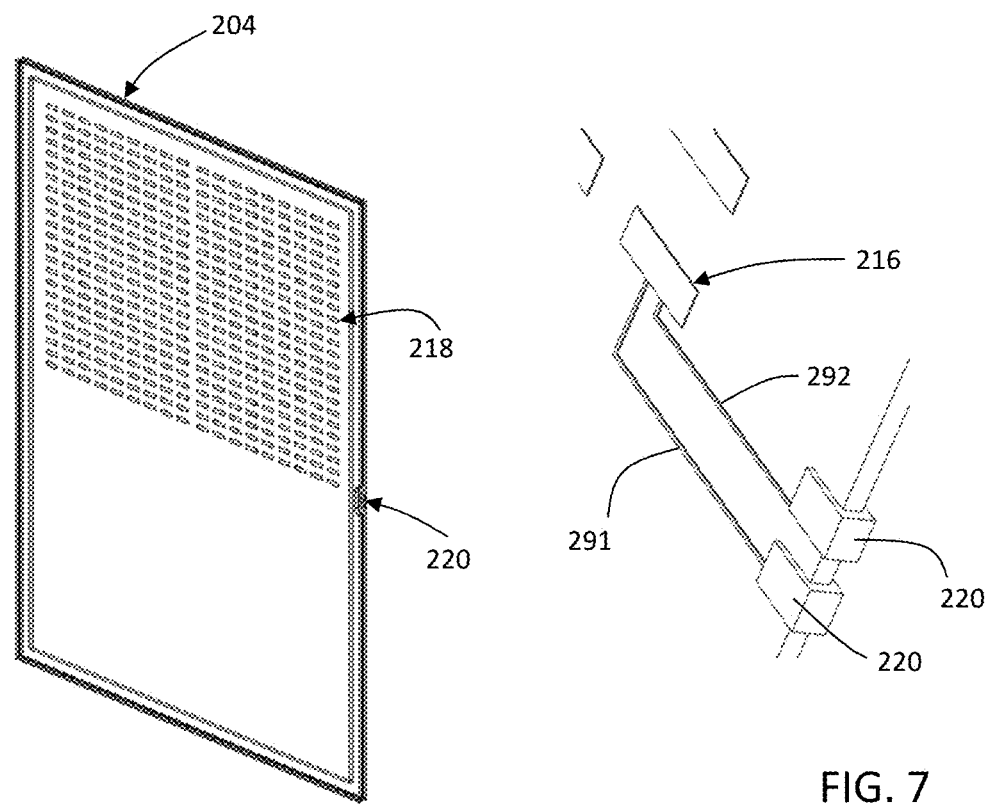
FIG. 6
FIG. 7
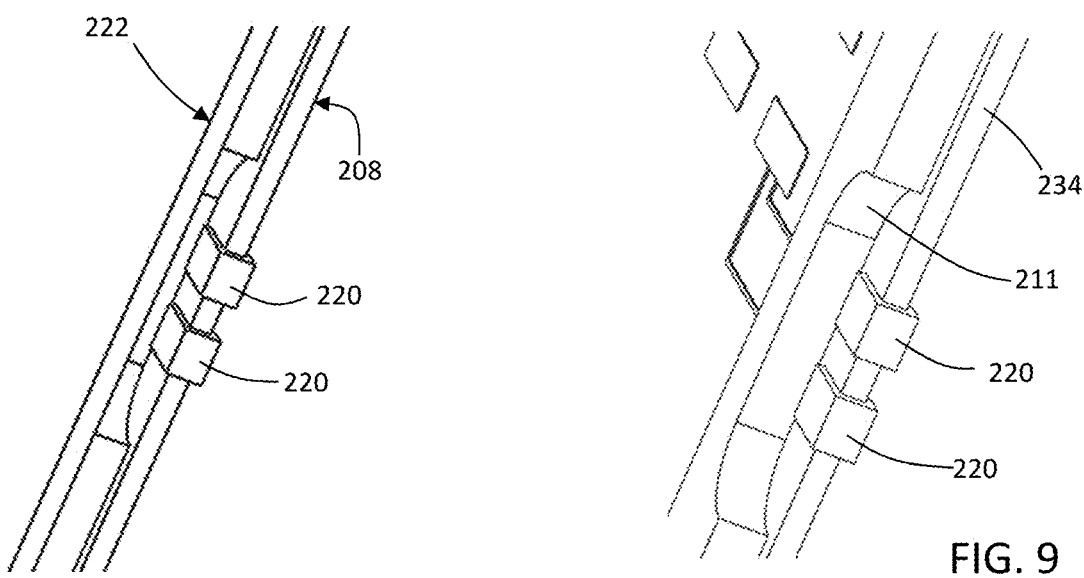
FIG. 8
FIG. 9

| SELECTED EXIT CONDUCTOR |
|---|
| TRAVEL PATHS |
| FROM SOLAR CELL TERMINALS |
| TERMINALS ON SOLAR CELL |
| ALONG SUBSTRATE SURFACE |
| ALONG RABBET |
| WITHIN ADJUNCT RECESS |
| ENTRY OF SASH PORT |
| THROUGH SASH PORT |
| EXIT OF SASH PORT |
| ALONG OUTSIDE SURFACE OF RAIL OR STILE |
| BRIDGE PORTION |
| ENTRY JAMB LINER |
| THROUGH JAMB LINER PORT |
| ALONG INSIDE OR OUTSIDE SURFACE OF JAMB LINER |
| ALONG INSIDE SURFACE OF FRAME |
| INSIDE EXTENSION CHANNEL |
| ENTRY PORT OF FRAME |
| THROUGH FRAME PORT |
| EXIT PORT OF FRAME |
| OUTSIDE EXTENSION CHANNEL |
| ALONG INTERNAL CHAMBER OF RAIL OR STILE |
| ALONG INTERNAL CHAMBER OF JAMB, SILL, HEADER |
| BEHIND INTERNAL FRAME MOLDING |
| WITHIN CRANK COVER |
| THROUGH ACCESSORY PORT |

FIG. 37

| SELECTED | |
|---|---|
| TERMINAL JOINER LOCATIONS | |
| FROM TERMINAL AT | TO TERMINAL AT |
| Surface of substrate (when solar cell on substrate) | Rabbet of rail or stile |
| Edge Mount Solar cell | Rabbet of rail or stile |
| Surface of substrate | Entry of sash port |
| Edge Mount Solar cell | Entry of sash port |
| Exit of sash port | Bridge portion |
| Bridge portion | Entry of Frame Port |
| 1st bridge portion | 2nd bridge portion |
| Exit of frame port | Conductor to solar system |
| Extension channel | Conductor to solar system |
| Internal or external extension channel | Accessory port |

FIG. 38

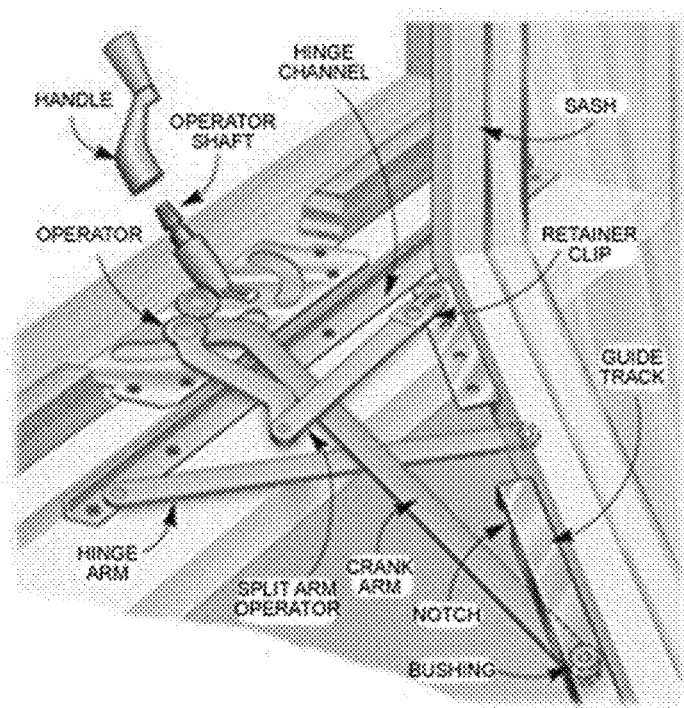
FIG. 41-PRIOR ART
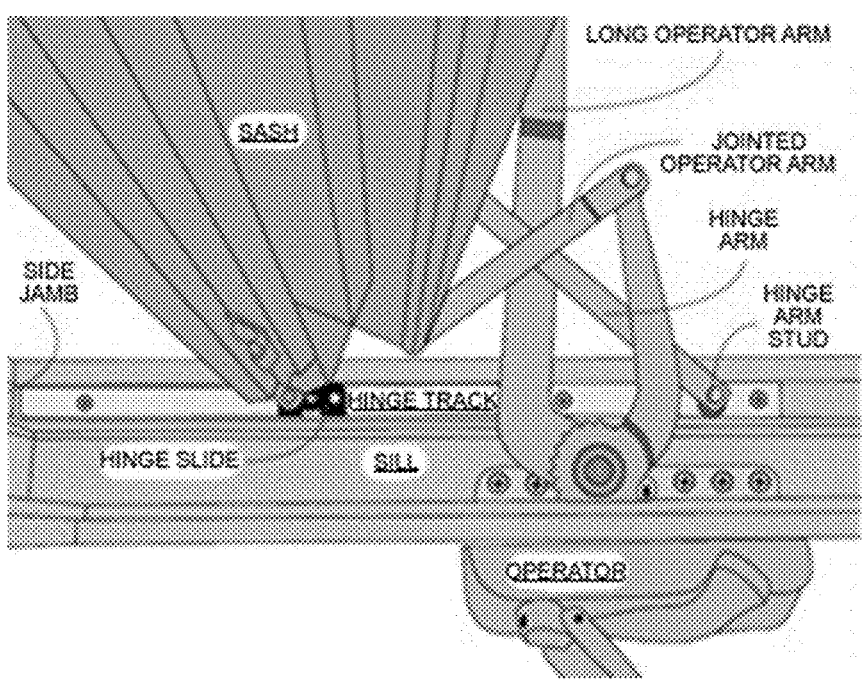
FIG. 42-PRIOR ART

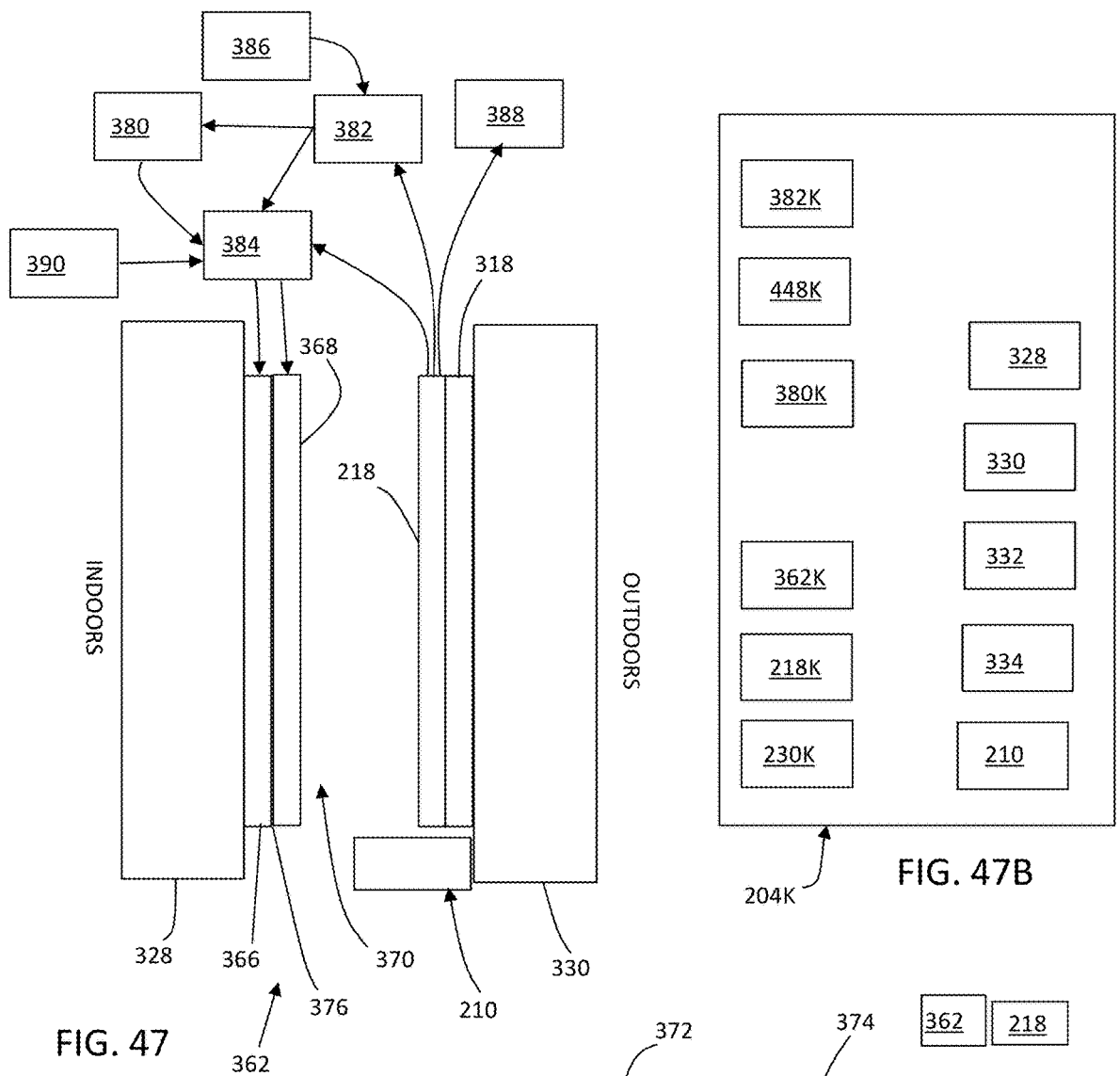
FIG. 47
FIG. 47B
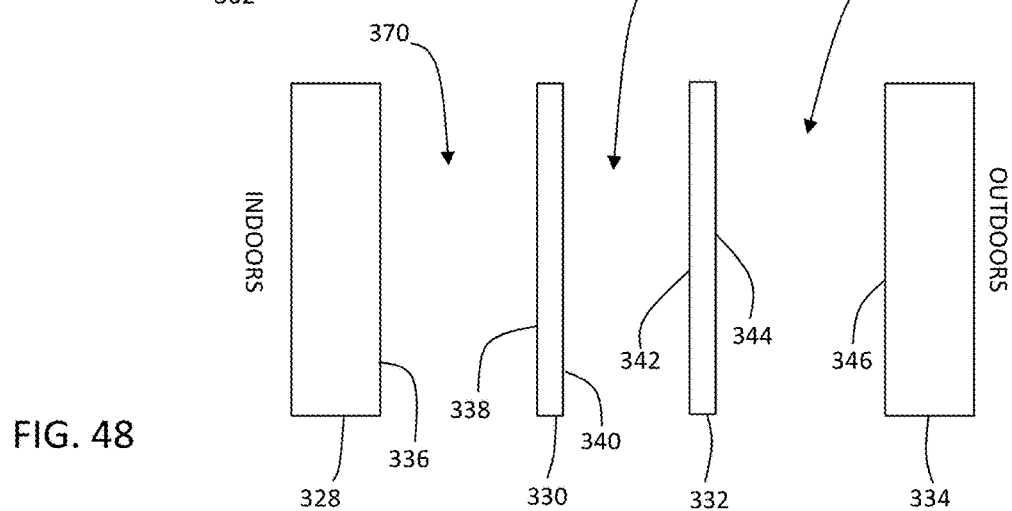
FIG. 48

SOLAR WINDOW CONSTRUCTION AND METHODS

This application is a US Continuation-In-Part Non-Provisional patent application and claims benefit of priority of U.S. Non-Provisional application Ser. No. 15/375,077 filed Dec. 9, 2016 and U.S. Provisional Patent Application No. 62265373 filed Dec. 9, 2015.

BACKGROUND OF THE INVENTION

Field of the Invention

The invention relates generally to transparent and semi-transparent solar collecting windows, and more particularly to the apparatus and methods of construction of transparent and semi-transparent solar collecting windows and accessories and methods of integrating and use of these accessories with solar collecting windows.

Background Description

As the concern of increasing amounts of greenhouse gases elevates, the world is looking for practical solutions for creating new greener forms of energy. Much has been said in the media about advances in the newer technologies such as electric cars, wind farms, improved batteries, and now solar collectors.

Traditional solar collectors are opaque thereby making them inappropriate for use as a glass replacement in windows. New transparent and semi-transparent (referred herein as simply 'transparent') solar collectors are by their nature clear and encouraging for use as a glass replacement in windows. The challenges of delicate electronic integration aside, substituting transparent solar collectors in the place of traditional glass in windows is desirable for at least the purpose of cleanly generating electricity without substantial change to the aesthetics of a building, home, or other structure. Enclosing homes and buildings with these solar collectors gives hope to the possibility of making these structures free of the need of external energy sources.

There are many different types of windows available to consumers today. Stationary, also known as fixed windows, are windows that generally have a frame but do not open to provide for the transfer of air nor allow the escape through the window in an emergency. These windows are also referred to as non-opening and alternatively non-operational windows. Opening windows, also known as operational windows, are windows having a portion of the window that does open to allow the passage of air, heat or cold, or for the escape of humans and other animals or for the release of toxic fumes or odors. Examples of these types of windows include casement, sliding, hung, and awning windows.

Integrating the transparent solar collectors into window systems, however, is not simply a matter of swapping traditional window glass with a transparent solar collector. This is particularly true for the operational variety of windows that open and close. These windows must not only open and close, they are typically expected to perform many other functions. For example, performance requirements of opening or fixed windows may include; being energy efficient, closing tightly, locking securely, opening and closing easily, resisting the natural elements, easy installation, easy to repair, easy to clean, reliable, durable, aesthetically appealing, fitting within a prescribed space in a wall, and inexpensive to manufacture. Over time window manufacturers have efficiently improved the design of traditional non-solar collecting windows as well as the manufacturing techniques. However, new techniques and designs are needed for mounting of the transparent solar collector within the sash and window frame of a home or other building in order to maintain continued performance and to route collected energy.

Many of the challenges of operational windows with integrated solar collectors are now considered. Unlike traditional glass, some transparent solar collectors include solar cell strips around the periphery of the glass or polymer sheet used as part of the collector. This edge may be wider and delicate and should be considered in the sash design to prevent damage to the collector. Novel methods of routing and connecting and disconnecting conductors traveling between the collectors or solar cells within the sash to a solar system circuit located within or outside the window frame are needed for the transference of electrical current from the solar collector. Novel conductors and methods of conducting current are needed that will withstand the repetitive opening and closing of slider, hung, casement, tilts and other types windows without destructive pinching of the conductors between portions of the sash or window frame or fracture of the conductors due to fatigue failure or other stresses placed on them. The conductors should be integrated into the window system without the introduction of features that will cause a loss of energy such as the leakage or heat or cold. The conductor should be easily released so that the sash may be removed for repair or cleaning without concern of damage to the conductors, solar cell or collector, or pulling of the conductor away from terminals on the collector or solar cell or elsewhere in the window system. The conductors, connection terminals, and conductor release mechanism should be hidden from view during normal operation of the window. The conductors and connectors should be designed to avoid damage due to water, ice, or other elements. The conductors should be configured to easily connect within a solar system of a home or building so as to minimize assembly during installation.

Similarly, conductor circuits and associated hardware are needed for the transfer of electrical energy collected from a transparent solar collector to power electrical connectors disposed on a portion of the window sash or window frame for powering or charging external electronic devices. In addition, conductor circuits and methods of storing power within a window sash or frame are needed as a convenient means to power or charge external electronic devices in instances when there is insufficient light to power the solar cell or collector. Novel uses of transparent solar windows need to be explored that provide convenient and functional options for accessories. Problems facing operable solar windows to some degree also apply to electrochromatic windows as both types of windows face challenges to transmitting electricity in an operable window.

SUMMARY OF THE INVENTION

Disclosed herein are several forms of transparent and semi-transparent solar collectors mounted within window scaffoldings or directly within window frames.

Defining various parts of a window assembly is helpful for describing and illustrating various aspects of the article of invention.

Argon—An inert, nontoxic gas used in insulating glass units to reduce heat transfer.

Balance—A mechanical device (normally weighted or spring-loaded) used in single- and double-hung windows as a means of counterbalancing the weight of the sash during opening and closing.

Casing—Exposed molding or framing around a window or door, on either the inside or outside, to cover the space between the window frame or jamb and the wall.

Casement—A window attached to its frame by one or more hinges pivoting about an axis. Often the pivot point is not fixed. In most cases the axis is vertical. In other forms of casements, windows hinged at the top are referred to as awning windows whereas those hinged at the bottom are called hoppers.

Check rail—The bottom horizontal member of the upper sash and the top horizontal member of the lower sash which meet at the middle of a double-hung window.

Clad—A rigid protective layer covering exterior wood parts of a window. In most cases this rigid protective layer is extruded aluminum either anodized or with a factory-applied finish to deter the elements.

Electrochromatic—a coating or film applied to a broad surface of a substantially transparent window substrate that in response to an electric current, the coating or film will vary in levels of opacity or tint, or opacity and tint. The electrochromatic films and coatings may comprise one layer or a plurality of layers. The layers may be controlled independently thereby providing a greater degree of control over respective levels of tint and opacity.

Frame—The assembled combination of a head, jambs, and sill that forms a precise opening in which a window sash fits.

Glass—A framed sheet of glass often used within a non-energy producing window frame.

Glaze—Refers to the assembly of a single or multi-pane substrate and associated parts that is seated within optional stiles and rails of a sash. The Glaze is sometimes referred to as the Glazing. Single-glazed refers to a single layer of glass or substrate and is typically the most energy inefficient. Double-glazed refers to two panes of glass or substrate with an intermediate spacer typically with an airtight seal around the periphery of the window pane. The air in the sealed space between the panes of glass is typically substituted with an inert gas such as Argon which has a lower thermal conductivity than air and thus a better insulator. A desiccant may be used in the spacer to absorb moisture. Triple-glazed is similar to double glazed but includes a spaced third pane of substrate to further boost insulation properties.

Grilles—Any bar that divides window glass into smaller panes. Also called a muntin, grid or windowpane divider. The grilles may be placed internal to two opposing panes or over an outside surface of a glaze.

Head—The main horizontal part forming the top of the window frame.

Hung windows—Windows wherein one (single hung) or both (double hung) sash are operable typically by sliding vertically. In most cases, operable sashes tilt for easy cleaning.

Jamb—The main vertical structural parts forming the sides of a window frame.

Lift-Handle—A handle for raising the lower sash in a double-hung window. Also called sash lift.

Lock handle—A locking mechanism located on the handle of a window.

Low-E—A coating on a substrate to minimize the amount of ultraviolet and infrared light that can pass through the substrate without significant compromise of the amount of visible light that is transmitted. This coating improves the efficiency of the substrate by reflecting heat yet letting light in.

Mullion—A major structural vertical or horizontal member to combine two or more windows together.

Operable—A sash that opens typically by sliding within the frame or pivoting on hinges with respect to the frame.

Operator-Crank—An operated device for opening and closing casement windows.

Pane—A single sheet of a substrate having a pair of opposing typically flat broad surfaces.

Spacer—A material placed between panes having a thickness that keeps the panes a fixed distance apart creating an air space therebetween.

Rabbet—A recess within a portion of the scaffold assembly for seating the glaze. The rabbet may include an adjunct recess to help house one or more of; the solar cell, conductor and additional solar parts. In some forms, the rabbet may be in the form of a wall facing the substrate.

Rail—Horizontal member of a window sash on a slider, double-hung or single-hung window.

Sash—A scaffold assembly with a glaze held therein. In a solar window the sash includes the solar cell, electrochromatic films and layers and associated components.

Scaffold assembly (scaffold, scaffolding)—An assembly of stiles and rails arranged to receive a glaze.

Sill—The main horizontal part forming the bottom of the frame of a window.

Sliding window—Windows that open by sliding horizontally.

Solar circuit—A term for the terminals and conductors responsible for providing a conduit for the electrical current produced by the solar cell to be carried to a useable destination.

Solar collector—A light collecting panel and cooperating solar cell which produces an electric current in the presence of a pre-determined light wavelength.

Solar terminal—Positive and negative points of connection on the solar cell.

Stile—The vertical support portions of a sash.

Substrate—The transparent or semi-transparent material used in a solar collector on which a solar coating or solar cell is formed. Commonly in the form of a glass or polymer.

Tabbing ribbon—A conductor for photovoltaic modules typically made of a copper ribbon or flat wire that is coated in solder.

The use of the descriptors transparent or semi-transparent (i.e. tinted) will collectively be referred herein simply as 'transparent'. Transparent solar collectors have a special quality of being able to produce an electric current for the benefit of the user though the collection of surrounding ambient light and sunlight. The transparent solar collector is utilized as a replacement for common non-energy producing glass in windows such as used widely in homes, offices, and other buildings. The glaze is typically square or rectangular for operational windows but may be formed in a wide variety of other shapes. Fixed windows are also most commonly square or rectangular. Fixed windows in shapes other than square or rectangular may be manufactured with reduced complexity since they are not required to open. The glaze is manufactured from one or more panes of a transparent flat substrate. The transparent substrate may be in the form of glass, a polymer, or other similarly performing material.

Various forms of the transparent solar collector portion of the glaze may be used for the generation of electrical energy and may be found in the prior art. For example, in one form of transparent solar collector the energy producing glaze is created using thin layers of liquid coating on a pane to produce ultra-small solar cells in array groups. The coating materials are organic polymers dissolved into liquid form. When applied to the pane, modules appear with a neutral tint. In this form the solar cells and arrays are created on the substrate to form the solar collector. In another form, thin-film solar cells are printed using perovskites on glass or similar substrates in a multi-junction architecture.

As an example of another form of transparent solar collector of the prior art, the energy producing glaze utilizes a pane covered with a specialized light responsive coating. The coating is primarily a composition of organic salts that absorb wavelengths of infrared and ultraviolet light that are invisible to the human eye. In some forms, the organic salts are blends of cyanine and cyanine salts. This light is trapped within the coating and transformed to glowing infrared light that is guided to the edge of the glass or polymer where the light is collected by solar cell strips adjacent the edge of the substrate that produce an electrical current. In some embodiments, a transparent solar collector is formed of a plurality of layers of coatings each having specialized light responsive characteristics so as to capture a predetermined light range wavelength thereby increasing the light to energy conversion. In some embodiments, the coatings have a nano thickness.

In some embodiments, a glaze utilizing s collector having edge placed solar cells may include one or more of the following features in single, double, or triple glaze configurations. In one form, a light responsive coating is applied one or more sides of the transparent substrate. In preferred embodiments a solar cell strip is roughly the width of or wider than the thickness of the pane and is secured generally parallel along one or more edges of the substrate and coating using a cell fixator. In embodiments utilizing more than one pane of glass, the solar cell may extend in width to collect light from a plurality of substrate edges. Alternatively, thin solar cell strips may used to collect light from individual panes. A light responsive side of a solar cell is positioned so as to capture the glowing infrared light guided to the edge of the substrate through the light responsive coating. When present, a cell fixator holds a solar cell in an optimal position to collect emitted light from a peripheral edge of a substrate and coating. In some forms a cell fixator may include a cell sealant for blocking out moisture from reaching the cell, and a cell shield to help prevent damage to the solar cell, or both. In some forms, a cell fixator, cell sealant, and cell shield are separate entities. In some forms a cell fixator may be in the form of an adhesive or adhesive sealant. In other examples, a cell fixator may be in the form of a plastic clip engaging both the solar cell and substrate. In some forms this plastic clip may serve as a cell shield.

In one form, a cell fixator is in the form of a tape spanning from a portion of the solar cell to the substrate. In some forms the tape may substantially or fully enclose the solar cell to the substrate to also serve as a cell sealant. The cell sealant serves to minimize moisture and other contaminants from contacting the solar cell. Other examples of cell sealants include various caulks such as silicone to seal at edges of the rail or stile where moisture might seep into a rabbet area or adjunct recess where a solar cell is located. In some forms a rail or stile will include a curved-in edge or weather strip as an additional or alternative method of sealing out moisture and other elements from reaching the inside of the rabbet. If present, a cell shield assists in protection of a solar cell and the associated conductors from damage particularly during assembly of the sash. For example, the cell shield may be in the form of a foam tape placed over the solar cell for protection during installation. The tape may alternatively be of a foam padded variety wherein it protects, seals, and positions the solar cell in an optimal position for collecting light. In some forms the solar cell may be enclosed in a reflective tape or reflective sock wherein any stray light not initially captured by the solar cell will be reflected back towards the solar cell.

In preferred forms, the solar cells are placed at all edges of the substrate for collection of light. In other forms, solar cells are placed adjacent one or more edges, but not all, to produce windows of various solar collecting efficiencies and cost. In some forms, mirrored surfaces may be placed adjacent the free edges of the substrate in attempt to reflect some of the collectible light back to one of the solar cells placed on another edge. A mirrored surface may include for example a polished aluminum plate or foil placed adjacent the open edge or a mirrored coating formed on the edge. Other examples include a mirrored tape enclosing the substrate edge.

In multi-pane configurations, panes are preferably spaced in dual pane and triple pane embodiments using a pane spacer placed about the periphery between the inner faces of the opposing panes. The pane spacer is configured to avoid harm to light responsive coatings or layers applied to the substrate surface. For example, the spacer substrate engaging surface may be smooth and broad whereas in other embodiments the surface may include narrow elongated ribs that may penetrate the coating but leave vast swaths of the coating untouched. In some embodiments a pane spacer is in the form of an elongated strip with pre-positioned shaper notches used to configure the spacer into a predetermined outer shape of the substrate profile. In some embodiments the spacer is in the form individual strips, U-shaped struts, blocks, tubes, or other shape sufficient for maintaining a space between the opposing substrates. The spacer may be configured to seat a grille or muntin in between the panes of substrate. In some forms the spacer is aluminum and preferably rigid. In other forms the spacer may be formed of materials having a lower coefficient of thermal conductivity such as a polymer.

In some forms a spacer includes a desiccant for the absorption of moisture. A primary sealer may be used to create an enclosed inner volume between the panes of substrate. Once sealed, the air within the inner volume may be replaced with an inert gas such as argon to improve energy efficiency. The primary sealer is applied circumferentially about the panes and spacer between the opposing substrate faces. A secondary sealer may be used to seal between one of the opposing faces of the substrate and spacer. The edge of the substrate is open for gathering of light by the solar cell.

In some embodiments a rabbet of a stile or rail comprises one or more additional adjunct recess if needed for housing one or more of a solar cell or associated parts such as a cell fixator, a cell sealant, a cell shield, and solar cell conductors. In some forms, one or more cell adjunct arms are included within the rabbet of a rail or stile to assist positioning or holding of one or more of a solar cell and associated conductors. In preferred embodiments adjunct arms are shaped to cradle or otherwise serve as positioning guides for the one or more solar cell and conductors.

Each solar cell or array of cells includes a positive and negative solar terminal for the electrical transmission of current produced by the cell. In some embodiments, these solar terminals are located on a surface of the substrate or off the substrate such as on the surface of a solar cell located adjacent the edge of the substrate.

An exit conductor serves as an electrical conduit for transmission of current generated by the solar cells on the sash to a destination at a window frame where the solar energy can be utilized or further transferred to a final destination. An exit conductor may be electrically joined to the solar terminals directly. However, due to the fragile nature of the solar cells, tabbing wire may extend from a solar terminal to a nearby grid terminal where it is joined with an exit conductor. An exit conductor may be joined to terminals and other electrical components in the solar circuit using any variety of joiners. Some examples of joiners include soldering often with the use of tabbing wire, resilient or spring biased clips, snaps, clamps, fasteners, adhesives, crimping, male-female couplers, and frictional fit such as a contact interference. Many of these connectors provide for rapid connection to end or intermediate terminals. For example, corresponding male and female spade connectors may be used for quick connect and disconnect. In other examples, a ring style end connector may be used for clamping to a threaded screw post or by a screw. In some embodiments having a plurality of solar cells, an exit conductor comprising both a positive and a negative conductor may travel from one solar cell or cell array to another to electrically join them in one or more of a series and parallel configuration. An exit conductor or portions of it may be pre-formed in pre-determined lengths and bent in shapes that will facilitate rapid assembly of a glaze within a sash or within a sash within a window frame. Various forms of clamps may be used to secure an exit conductor within a port. For example the exit conductor may extend through a compression grommet or secured with adhesives or fasteners.

Exit conductors extending from solar terminals transmit current from a solar cell to various transmission points such as one or more of; a solar system within a building, an electrical circuit, an outlet located inside or outside the window frame, an inverter, and other points capable of making use of the energy supplied.

An exit conductor includes a sash lead at an end nearest the solar cell, and a functional lead at an opposite end. Along its length, an exit conductor may be in the form of a single continuous conductor portion or may comprise one or more of unbroken and electrically joined broken segment portions configured to perform pre-determined functions. Although not required, in preferred embodiments an exit conductor and intermediate electrical connectors may be insulated, weatherproofed, or both. Broken segment portions may be joined and accessory circuits may offshoot from various junction devices using a joiner as introduced above. Joiners are preferably quick release in areas of disassembly such as for removal of the sash from the frame or when replacing a solar collector within a sash. In some forms, continuous conductor portions though unbroken may include pass-though joiners for the option to electrically connect to a conductor without the need for it to be severed.

An exit conductor may be identified in portions relative to where it resides within a window assembly. Some embodiments of solar windows do not require all portions. Beginning at the sash lead, the portion of an exit conductor housed within a sash rail or stile is a sash portion. The portion of an exit conductor residing between a sash and a window frame is a bridge portion. The portion of an exit conductor residing within a window frame is the frame portion. Final portions of an exit conductor after exiting the frame portion is an extension portion.

In preferred embodiments an exit conductor further comprises a negative and a positive exit conductor portion. Each negative and positive exit conductor portion is electrically coupled to a respective positive and negative solar terminal. The configuration of an exit conductor may vary primarily depending on the particular challenges of the window system in which it is used and on the performance expected. In some embodiments, the same type of conductor may be used throughout an entire exit conductor. In other embodiments various portions of an exit conductor may comprise different types of conductor materials and configurations. For example, an exit conductor may be in the form of a mono-filament or multi-filament wire throughout its length. This type of conductor can work well for a fixed window system where no movement is required between a sash portion and frame portion of a window. This includes some fixed window embodiments where a glaze may be mounted directly in a window frame without a scaffold assembly. However, although it may be used, mono-filament and multi-filament wire may not perform sufficiently long term in areas such as fatigue strength in operable windows in portions of a window where a sash is repeatedly opened and closed. In operable windows, substantial motion in an exit conductor occurs in a bridge portion whereas other portions of an operable window such as the sash and frame portions generally encounter very little movement. Again, to meet these varying demands, portions of an exit conductor may be manufactured differently or the same. For example, in one embodiment an exit conductor's sash and frame portions are comprised of an elongate wire while the bridge portion comprises a conductor that is characteristically more flexible while having a substantial fatigue life. In addition, closing of a sash is often characterized by a tight fit between a sash and frame of a window. In some embodiments thin flat conductors are utilized providing less interference at the closure interface between a sash and frame.

In one embodiment, a bridge portion or other portions of an exit conductor are in the form of a flexible bus bar or braided wire or super elastic conducting metals such as nitinol. In another embodiment the bridge portion is in the form of a conductor on a flexible sheet such as a printed circuit board (PCB). The PCB is preferably flexible or semi-flexible. A flexible sheet may be single sided (conductor only on one side) or multi-layer often having a thickness generally between 50-800 microns. A conductor joined to the flexible sheet is generally 9-35 microns thick and manufactured of a conductive material such as copper. A flexible sheet in preferred embodiments is typically based on polyimide (PI), however many other suitable substrates may be used, examples including PET (polyethylene terephthalate) and PEN (polyethylene naphthalate). A PCB may assume a bent, twisted, accordion, folded, or other configuration helpful for assuming a compact profile but also an extended or elongated profile as the sash moves. In some embodiments, flexible sheet conductors are used for more than a bridge portion of an exit conductor. Their thin profile and capacity for manufacturing in predetermined shapes and sizes eases assembly. In addition, cover layers may be used as a protective insulating barrier if desired. Access holes in a flexible sheet can expose terminal leads for connecting to other components or terminals generally using small screws extending therethrough, spring clips or other joiner. In some embodiments a flexible sheet may be secured by adhesion and other mechanical methods to the stile or rail. For example, adhesion such as two-way tape may be used or an adhesive layer may be formed directly on one side of the flexible sheet or both. In some embodiments, an adhesive protection layer may be peeled off to expose the adhesive layer on the flexible sheet. In other embodiments, the flexible sheet may be secured by mechanical methods such as one or more of snaps, deflectable posts, and cradling arms.

In some embodiments electrically functional electronic or optical inks or both are used for deposit on a substrate creating one or more active and passive devices such as thin film transistors, capacitors, coils, and resistors. These elements may be utilized to create circuits to assist with controlling or regulating or both the output of the solar cell for predetermined functional purposes. In some embodiments, portions of an exit conductor may be formed within a portion of or upon a surface portion of a scaffold assembly or both. For example, a conductor may be printed on a surface of a rabbet as a substitute for separated conductor components such as wires. Similarly, conductors may be printed directly on the substrate of a glaze. Alternatively, conductors may be formed within a body of a rail or stile or both during a molding or extrusion process wherein a polymer forms about a conductor.

In some embodiments, electrical connections between a solar cell and portions of an exit conductor are made by positional contact interference whereby a conductor terminal on one part is secured by pressure against a terminal on another part. For example, a conductor terminal such as a solar terminal at a predetermined location in electrical communication with a solar cell is formed on a substrate and an opposing conductor terminal at a predetermined location is formed on, placed in, or secured to a surface of a rabbet. Placement of a glaze within a scaffold assembly causes a two conductors to be in oppositional contact with each other and therefore capable of the transfer of electrical current from a solar cell to a sash portion of an exit conductor without the use of a mechanical or chemical connection between terminals. A glazing bead typically seated within a glazing bead recess in one or more of a rail and stile may be used to secure a glaze within a rabbet typically by applying an amount of pressure against the substrate. A glazing seal may be present to reduce seepage of outdoor elements into a rabbet area. In other forms a glaze may be secured within one or more of a rail and stile using plastic welding.

In an alternative embodiment, a conductor terminal may be formed on surfaces other than a substrate or on coatings on the substrate. For example, an exit conductor terminal may be formed at a predetermined location on one or more of; a portion of a solar cell itself, on a cell shield, and on other nearby surface having direct electrical communication with the solar cell. These locations are preferred when the solar cell is situated adjacent the substrate edge. Similarly, positional contact interference may be used as a method of connecting a plurality of solar cells. For example, conductor terminals on conductors at pre-determined positions on the rabbit are located at positions opposing terminals in communication with other solar cells placed along an edge of a substrate. Assembly of a glaze within a glaze cup formed by rabbets and adjunct recesses results in a consequent alignment of opposing conductor terminals and therefore electrical communication between the solar cells without the need for separate wiring. In most embodiments both positive and negative conductors will be included.

As discussed previously, in some forms one or more solar cells are secured to a substrate adjacent and opposing a peripheral edge of a substrate then assembled within a glaze cup formed by rabbets. In an alternative embodiment, one or more solar cell are secured in a rabbet instead of a substrate using an alternative form of cell fixator. Once the solar cells are secured in the rabbet, a glaze is then placed within a glaze cup formed by a rabbets adjacent the pre-positioned solar cells. Cell shields or sealants may still be applied for their original functional purposes as described earlier.

In an alternative embodiment, positional contact interference may be used to conduct electrical current between a sash portion and a window frame. For example, in a casement window, one or more terminals may be placed at a predetermined position on a lateral hinge side of one of the rails or stiles of a scaffold assembly. One or more terminals are also placed at a predetermined position on an inside window frame directly opposing the respective terminals on a scaffold assembly. As an incidence of closing a casement window and therein the sash to seat within the window frame, the opposed respective conductor terminals are seated against each other closing the circuit and providing for the flow of current between a sash portion and frame portion of an exit conductor. In this form however, the solar circuit is only closed when the window is closed.

Positional contact interference may also be used in a sliding window to conduct current from a sash portion to a frame portion. In one embodiment for example, a sash portion of an exit conductor extends to a one or more contact terminals on a lateral surface of a stile or rail that is in sliding opposition with a jamb (sill, header, or jamb) of a window frame. The contact terminal on the stile or rail extends at least partially along the lateral elongate surface length of the stile or rail. A contact terminal located on an opposing medial surface of an adjacent window sill jamb is positioned to remain in oppositional contact with a contact terminal on the stile. A contact terminal on a scaffold and a contact terminal on a frame may be of a variety of lengths extending along the axis of movement between the sash and frame. In preferred embodiments a terminal on the scaffold is longer and may extend substantially the entire length of a sash. In preferred embodiments, a terminal on a frame is substantially shorter and is located near the middle of the frame. In this configuration, a sash may be slid between a fully opened position and a fully closed position while maintaining a closed solar circuit during the full range due to constant contact between the terminals. This configuration also fully hides the terminals from exposure from contact that may cause a short or damage to a component of the electrical system. The opposed terminals may be located on any side of a window. If the opposed terminals are positioned at the bottom of a window, the weight of the window may improve interference between the contacts however they may be more apt to exposure from the elements when the window is left open. If the opposed terminals are positioned at the top, the weight of the window may reduce interference between the contacts but they will be less exposed to the outside elements.

Numerous forms of terminals may be used for positional contact interference. In a one form the contact terminals are fixed. Fixed contact terminals are exposed conductive materials typically extending from a non-conductive surface and formed without the ability to deflect. Examples of a fixed terminal would be a copper pod printed on a flexible sheet and a flat protruding boss. Misalignments between a sash and frame can cause fixed terminals to separate causing undesired opening of a solar circuit. In other forms, the terminals are resilient. Resilient contact terminals comprise a portion that is biased towards an opposing terminal. For example, in one form a resilient terminal is in the form of a resilient metallic strip electrically connected to an exit conductor. The resilient metallic strip creates a spring force against the opposing contact terminal regardless of small misalignments between a sash and frame. In another form of resilient contact terminal, a terminal is biased by a spring in turn causing the terminal to be biased against an opposing terminal. A resilient contact terminal may be located on a sash side or frame side or both. In one form, a contact terminal may be of a fixed type but may become resilient as a result of a small change in its shape. For example, a fixed contact terminal may be formed from a flat metallic strip extending through a sash port (also termed a scaffold port). Each end of the strip is bent generally 90 degrees at each end of the ports so that its legs lie or are otherwise secured flat against the surface of the stile or rail in a U-shape. One or more of the legs of the same metallic strip may be bent outwards like the legs of the letter 'W'. Deflected outwards, this leg now has a resilient ability to create a spring force against the opposing terminal regardless of small misalignments between a sash and frame. The resilient leg of a terminal may be formed in a variety of shapes such as bubble or arched.

In some embodiments, a sash does not close or slide directly against a frame. A jamb liner may be used as an intermediate separator. In this configuration one of the contact terminals may be disposed on a surface of the jamb liner in opposition to an opposing contact terminal. The jamb liner may be biased towards the sash therein creating an effective seal between the sash and the jamb and a smooth sliding interface therebetween. The bias also assists (much like a resilient terminal) in keeping the opposed terminals in contact thereby maintaining a closed solar circuit as the sash is moved to open and closed positions. A bias may be created by applying a small force to the sides of the jamb liner when coupling to the jamb causing deflection of the liner toward the sash or by other methods such as placing resilient foam behind the jamb liner. In alternative embodiments, a jamb liner may be instead secured to a sash or dual opposing liners on a sash and frame may be used. In preferred embodiments such as with hung windows, a jamb liner is secured to a vertical jamb of a window frame and preferably manufactured of a smooth flexible polymer. A contact terminal is formed or mounted on a surface of the jamb liner accessible to the opposing terminal on the sash. A jamb liner contact terminal may extend towards a jamb through a jamb liner port or wrap around an edge of the liner before traveling toward the jamb. In this configuration, an enclosed space between a jamb and a jamb liner can serve to protect and insulate an exit conductor as it travels to an exit location through a frame port. A similar arrangement using liners between a sash and frame may be used in sliding style windows. In some embodiments, a hung window jamb liner includes a balance cavity comprising a line with one end secured to a balance typically in the form of a weight or spring. The line extends over a pulley at the top of the jamb with the opposing end of the line secured to a sash. The balance offsets the weight of the sash thereby making the sash lighter and easier to raise. In some embodiments, portions of an exit conductor travel within the balance cavity. In some embodiments a sash and jamb liner intermesh through the formation of a sliding tongue and groove relationship.

In a casement style window, a compact profile of a bridge portion fits well in the reduced space provided as the sash closes against a frame whereas the elongated profile of a bridge portion accommodates for increased distance between the sash and frame as the window opens.

In other embodiments a bridge portion conductor is in a resilient form such as an extension spring that is pulled into extension by an opening sash and is biased to spring back to a compact position as the sash is closed. Alternatively, a compression spring is used wherein it is pushed into a smaller compression profile upon closure and returns to an extended profile when the sash is opened. Similarly a coiled spring may be used for this same purpose. The springs may be insulated to prevent undesired electrical conduction.

In some embodiments one or more of a stile and rail and window frame may include features to guide or house or guide and house a bridge portion of a conductor as it moves between a compact profile and an extended or elongated profile. A bridge recess may be positioned within one or more of a stile, a rail, a jamb liner, and a frame to house at least a portion of a bridge portion of a conductor as needed during sash closure or movement. Optionally a bridge guide may be used to prevent the bridge portion from becoming pinched or crushed during closure as the sash of a casement style window snugs into the frame or moves along the frame of a sliding window. In some forms a bridge guide may be in the form of a piece of plastic, a coiled spring, or guiding wire. In some embodiments a bridge portion is entirely hidden between a rail or stile and frame of the window when the sash of the window is closed. Alternatively, the bridge portion may be concealed within a coupling chamber. A coupling chamber is an enclosed space formed between a closed casement sash and one or more of a window frame and a jamb liner.

In other embodiments, a portion of the of a bridge portion is visible when a window is closed. For example, an exit conductor may exit a scaffold assembly from an outdoor facing surface of one of the rails or stiles, then extend towards the window frame before reentering the window frame at a nearby outdoor facing surface. Similarly, an exit conductor may span across two indoor facing surfaces of a frame and sash. In another example, such as when an exit conductor is in the form of a flexible sheet, a fold portion of the exit conductor may extend beyond opposing sash and frame faces to prevent stress over the fold of the conductor.

A rabbet of one or more of a rail and stile may comprise one or more drain holes positioned to provide the gravitational release of moisture that may accumulate in a rabbet. If present, a drain hole is preferably located between a rabbet and outside wall of at least a lower rail. A scaffold port extends between a rabbet and an outside surface of at least one part of the scaffold. In preferred embodiments the scaffold port resides in a stile or rail on the hinged side of a casement window. In preferred embodiments of sliding windows, a scaffold port resides in one or more of stiles and rails that slides adjacent the window frame. In this embodiment, the scaffold port is configured in size and shape to provide for passage of a portion of an exit conductor including any end or intermediate connectors or terminals that must pass through the port. In some embodiments a scaffold port profile reflects the profile of the conductor to be used. For example, a rectangular port may be used for passage of a thin sheet style conductor. A scaffold port may be tapered at its outlet to reduce binding or stress on the exit conductor. The scaffold port may be sealed with a sealant if so desired. The sealant will help reduce movement of the exit conductor, seal out elements from seeping in, while also providing a cushion to the exit conductor.

In some embodiments, a scaffold terminal is positioned at an exit of a scaffold port joining a bridge portion with a sash portion of an exit conductor using a joiner. An exit of the scaffold port may be enlarged and configured to house and in some cases seat and secure the joiner. A scaffold port cap is present in some embodiments to cover the scaffold terminal from vision, outside elements, and inadvertent contact. Similar caps may be used to cover terminals in other locations. A scaffold terminal provides for quick disconnect of a exit conductor in the event the sash needs to be separated from the window frame in instances such as repair.

In some embodiments, a bridge portion of an exit conductor may extend through one or more of a hinge, window lock, and crank mechanism. This configuration is predominantly useful for casement style windows having a hinge or other similar pivot mechanism for opening a sash of the window by pivoting it away from it's frame. In one embodiment, a hinge comprises integrated conductors on opposed faces of the hinge capable to transfer electrical current through the hinge from the sash to the window frame while the sash is stationary or pivotally moving. In this configuration, conductors on the hinge serve as the bridge portion of an exit conductor. One or more hinge insulators may be present to separate a conductor portion from spilling current to a hinge portion and to protect any inadvertent shorts across the hinge conductor portion. Likewise, in some embodiments an exit conductor may extend across or through one or more of a crank mechanism and window lock in serving as a bridge portion of an exit conductor. Common crank mechanisms are illustrated in FIG. 41-42.

A frame of a window typically comprises a head at a top, a sill at a bottom, and jambs on opposing sides. A frame port extends between an inside surface of at least one part of the frame and an outside surface of the frame. In preferred embodiments a frame port resides in a head, sill, or jamb on a hinged side of a casement window. In preferred embodiments of sliding windows, a frame port resides in one or more of a head, sill, and jamb opposing the scaffold port. The frame port is configured in size and shape to provide for the passage of a portion of the exit conductor. This may be the conductor itself or may also include any end or intermediate connectors or terminals that must pass through the port. In some embodiments a frame port profile reflects a profile of a conductor extending therethrough. For example, a rectangular port may be used for passage of a thin sheet style conductor or the frame port may be enlarged to also pass an end connector. A frame port may be tapered at its inlet to reduce binding or stress on an exit conductor. A frame port may be sealed with a sealant if so desired. This will help reduce movement of an exit conductor, seal out elements from seeping in, while also providing a cushion to the exit conductor.

Each conductor passing port may include a port clamp to limit the pull on conductors. For example, in one embodiment a port clamp may be mounted in a port in which a conductor passes through. A port clamp may be secured by fasteners such as screws, and adhesives or other means. In some forms a port clamp includes an internal passage in which a conductor passes and a deflectable clamp portion that squeezes against the conductor as it is inserted into the port. In other forms the clamp is self-locking wherein one portion of the clamp interlocks with another portion of the clamp to tighten on the conductor.

In some embodiments a frame terminal is positioned at an entry of a frame port joining a bridge portion with a frame portion of the exit conductor using a joiner. The entry of a frame port may be enlarged and configured to house and in some cases seat and secure a joiner. A frame port cap is present in some embodiments to cover a frame terminal from vision, outside elements, and inadvertent contact. In alternative embodiments, a frame terminal is positioned within an outside wall of the frame. An extension portion of an exit connector may be connected to the frame terminal. From here an exit conductor may be directed for connection to one or more of a home solar system and an inverter. Alternatively, an extension channel may extend from an exit of a frame port along an outside surface of a window frame to house an exit connector. In some embodiments, an extension channel travels toward an access window. At the access window, an exit conductor may provide power to electronic accessories as will be further explain in upcoming paragraphs.

In a one form, a disclosed solar window assembly may be configured to transfer electrical energy from a solar cell within a solar window to a solar energy system in a building and potentially to a local energy grid. For example, the electrical energy generated may be conducted through an exit conductor to a nearby inverter which may be used to reduce the demand for energy consumed from electricity providers or sold to an energy provider.

In one form, functional configurations disclosed herein for transporting power along an exit conductor from a transparent solar collector on a moveable sash is applied to providing power to an electrochromatic layer on the sash of an operable window.

In other forms, a window assembly comprises one or more features to enable extended capabilities. In one form, a window assembly comprises access to a window's solar cell circuit through terminals located and secured on or extending from sash or frame surfaces of the window assembly facing the in-doors. For example a window's solar circuit may be configured with one or more outlets for one or more of charging and operating electronic devices such as a cell phone, tablet, and computer. For example, in one form an outlet and circuitry conforms to USB port standards and in some embodiments other known electrical standards for powering electronic devices. Incorporating these power outlets into every window assembly may not be cost effective or aesthetically desired but may be provided as an option to consumers. In alternative embodiments, a solar window circuitry is configured for access from one or more of sash and frame surfaces facing in-doors through an accessory access window. The access window may be covered by a removable or retractable cap. If a user choses to utilize the extended features of a solar circuitry, accessory devices may be purchased separately to plug into the solar window circuitry after removing or retracting the cap (if so equipped). For example, an accessory device available for purchase (or provided with the window) may include one or more of: a USB port, various charging outlets, a night light, various lighting devices like flashlights and holiday theme lights, a cell phone, a tablet, an IPad type device charging outlet which may include an integrated stand for supporting the device, an electric pencil sharpener, a portable fan, a battery charger, and other portable electronic devices. The accessory device may include one or more of retainers such resilient clips and other forms of fasteners which may be used to hold an accessory within an access window and reliably connected to a solar circuit. In some forms an access window includes complementary retaining features such as tabs for holding resilient clips.

In an alternative embodiment, direct access to a window's solar circuit is not directly provided from an indoors position. Absent are exposed solar circuit conductors, removable caps, and retractable caps over solar circuitry. Instead, access to an accessory access window requires the user to perform a mechanical operation at a pre-determined in-door location in the surface of a sash or frame facing the in-doors. Examples of mechanical operations include cutting, drilling, or prying a surface of the sash or frame facing the in-doors. Below this surface the user exposes solar window circuitry such as the exit conductor and in some embodiments electrical joiners for rapid connection to these circuits are provided. In some forms, the solar circuitry resides in a sub-surface access window formed in a non-visible portion of the window frame or sash. For example, a sub-surface access window is formed by a bored hole in an outer surface of a window frame. Here an access window is not visible after install, but may be accessed using one of the operations described above.

In some forms a window crank cover provides an alternative location for integrating an accessory device. The accessory device is coupled a window's solar circuit accessible beneath the crank cover. In some forms crank covers are swappable. For example, at the time of purchase of a casement window, the purchaser may designate an ordinary crank cover (no accessory) or a cover with integrated accessory device such as one or more of a USB port and other accessories including those listed above. Alternatively, the user may choose alternative crank covers with integrated accessories after purchase or after window install. In this embodiment, the solar circuitry is modified to provide electrical joiners below the cover for electrical coupling between the crank cover accessory and the solar circuitry. In preferred embodiments the crank cover plugs into joiners in the circuit as a method of rapid connect and disconnect. In yet another alternative, a window crank cover may include an accessory access window assessable by removable cap, retractable cap, or by a mechanical operation as described previously. Accessory devices configured for mounting within a window crank cover may be supplied by one or more of; with the window and purchased separately.

In alternative forms, a battery cavity may be integrated into one or more of a scaffold and frame of a window assembly to hold batteries. In preferred forms, the batteries are removable from an indoors side of a solar window. Inside a battery cavity are electrical battery receiving terminals and conductors for joining the batteries with the window's solar circuit. A battery cavity preferably includes a battery cap helping hide it from view of a user. One or more rechargeable batteries are seated in the battery cavity and electrically joined to the solar circuit.

In one form, a window's solar cell provides electrical energy during daylight to charge a rechargeable battery through use of a solar circuit. Electrical energy stored in these batteries can then be used at the user's discretion. During daytime or darkness the charge in the battery may be utilized to power or charge any number of accessories joined with a window's solar circuit. In some forms, a rechargeable battery may be configured for removal and used to power other electronic devices such as a game controller or TV remote. In other forms, one or more lights positioned for glowing through a substrate of a sash is powered by the battery and activated by a photo-resistor at darkness or by user activated switch. The light may extend from one or more of; an outlet in the sash, a frame, a crank cover of the window illuminating through the substrate, from a spacer and illuminating from between the two panes of substrate. In alternative embodiments, lights may be configured with a theme displayed through the transparent substrate. In one holiday theme for example, the light may glow in the shape of a candle or Christmas tree. Other well recognized figures may be available such as one or more; pumpkins, flags, turkeys, crosses, bunnies, Easter eggs, peace signs, and hearts. Figures such as these may be used with a solar window to help celebrate a season or communicate a message with minimal expenditure of energy or the effort of hanging lights and running electrical cords. In this embodiment, changing light figures is as simple as unplugging the light figure from the solar circuit outlet and replacing with a different light figure. In some embodiments lights are configured to flash or change colors.

In some embodiments a glaze substrate comprises a low-E coating to reflect heat yet allow light through the substrate. If used, applications of a low-E coating are preferably avoided that would diminish light that can be captured by the solar cell and used for generation of electrical energy. In preferred forms, coatings are applied to a substrate on internal facing surfaces where a coating is protected by a layer of substrate.

In some embodiments one or more broad surfaces of the panes in a glaze is electrochromatic in which materials on the pane substrate, usually an electrochomatic layer in the form of a coating or film, switches between generally transparent and opaque when an electrical voltage is applied to the electrochromatic layer. In other forms, the electrochromatic layers are tintable. This feature provides a solar window assembly the capability of various degrees of darkening or tinting, or darkening and tinting upon user demand by one or more of; activating a switch, knob, and other control (wired and wireless).

In one form, electrochromatic coatings utilized on the broad surfaces of a substrate facing an internal space comprise a plurality of layers of a metal oxide. Ions move between the metal oxide layers when an electrical voltage is supplied resulting in a consequent change in tint level on the substrate.

In one form, darkening or otherwise a change in tint and/or opacity may occur with automatic adjustments at dusk, dawn, and throughout the day. For example, an electrochromatic film may automatically adjust to opaque at night and return to transparent at dawn through the use of a photosensor such as a photoresistor that senses ambient outdoor light.

In one form, a control system processes feedback from one or more sensors that are integrated into the window assembly or located outdoors or elsewhere to process outdoor weather conditions and responsively adjust one or more of electrochromatic window tint and opacity to create a preferred lighting environment within one or more rooms of a building.

In one form, control over one or more of opacity and tint of a window controls levels of glare and heat. Such control can result in a significant reduction of energy consumption typically required to heat the indoor space while concurrently blocking out a significant amount of UV light.

In one form, the electrical current required to drive an electrochromatic feature may be supplied through a solar circuit from one or more of; a window's solar cell, from a battery contained in the battery cavity, and from an external battery joined to the circuit though an accessory access window as introduced earlier.

In one form, voltage is applied to electrodes on each side of a separator within an electrochromatic layer causing lithium ions to migrate through the separator to the outermost electrode where they scatter most incoming light. This causes the substrate to appear opaque. The lithium ions remain in this position until the voltage is reversed causing them to move back so the substrate appears generally transparent once again.

In one form, electrical power is only needed when changing from one state to the other and may be drawn from power generated by a solar window. In some embodiments, a small electrical charge is required to maintain a particular state such as opaque or transparent.

In some forms, one or more electrochromatic coatings are applied to a broad surface of a substrate.

In one form, an electrochromatic coating operable to control a liquid crystal technology.

In one form, interior sealed spaces between panes of glass are filled with an inert gas such as argon. A dual pane configuration comprises a first interior sealed space (between a first pane and second pane). A triple pane configuration comprises a first interior sealed space and a second interior sealed space (between a second and third pane). A quadruple pane configuration comprises a first interior sealed space, a second interior sealed space, and a third interior sealed space (between a third and fourth pane).

In one form, internal layers of a triple pane or quadruple pane glaze comprise an inner polymer suspended film to reduce weight and to keep the overall glaze thickness manageable while still dividing the internal space. The outer glass substrates assist in protecting the internal suspended films. In preferred embodiments, Low-E coatings are applied to one or more broad surfaces on substrates of the internal spaces.

In one form, electrochromatic coating is applied to one or more broad surfaces of substrate facing inside the: first interior sealed space, and the second interior sealed space (if present), and the third interior sealed space (if present).

In one form, one or more of a first, second, third, fourth, fifth, and sixth broad surface of interior sealed spaces are utilized for application for one or more of solar, electrochromatic, and low-E coatings.

In one form, a transparent solar collector is positioned on broad surfaces of a glaze closer to the outdoor side of the window whereas electrochromatic layers are positioned closer to the indoor side of the window. Such arrangement facilitates optimal energy collection from the transparent solar collector when tint or opacity is from the electrochromatic layer is present.

In one form, at least one pane is laminated for improved strength.

In one form, electrochromatic coatings or films are at least partially powered by energy transferred from said generally transparent solar collector portion. In some forms, the energy collected from the transparent solar collector portion is first stored in a battery for on demand use by the electrochromatic layer.

In one form, one or more electrochromatic layers in a solar collecting window is powered by a wireless energy source.

In one form, electrochromatic layers in a solar collecting window is powered by wireless energy in the form of magnetic resonance technology In one form, a solar collecting window is electrically coupled with a wireless power transmitter to wirelessly transfer power generated from the solar collecting window to be used elsewhere.

In some embodiments the substrate surface of a glaze facing the outdoors is coated with a photocatalytic titanium dioxide coating that causes the substrate to be self-cleaning. The coating is hydrophilic. When UV light hits the titanium dioxide coating of the substrate, electrons are generated turning water molecules from the air into hydroxyl radicals causing a chemical reaction. The hydroxyl radicals attack and break apart organic material into smaller pieces that are washed away by rain resulting in a clean window.

The ends of a stile and rail are manufactured in complementing forms so as to form a scaffold assembly about a glaze. Although many other shapes may be created, typically the scaffold assembly is generally square or rectangular and thus the rails and stiles are assembled substantially perpendicular to each other. In one form, a stile and rail ends are mitred at approximately 45 degrees then secured together by polymer welding techniques. In preferred embodiments the polymer is PVC. In other forms a stile and rail are assembled using fasteners potentially with the assistance of plates. In other forms adhesives are used. In yet other forms specialized cutters are used to create variations of different tongue and groove assemblies which are then fit together using one or more of glue, nails, screws, and other fastener. Wood portions of a window assembly including a sash and frame may be treated with one or more of wood stains and sealants. Exposed surfaces of wood may be covered in a clad of aluminum or polymer.

Rabbets and adjunct recesses (if present) in the stiles and rails form a glaze cup within the scaffold assembly for seating a glaze and other electronics and conductors located at the periphery of a substrate. One or more of a cell fixator, a cell sealant, and a cell shield may be utilized for the reasons previously discussed. During assembly the glaze is fit into the glaze cup carefully routing any portion of the exit conductor to avoid undesired pinching of the conductor and to avoid routing of the conductor to places where it may cause an improper seating or seal between the glaze and scaffold assembly. In one embodiment, one or more of a fixed and resilient terminal in electrical communication with a solar cell is formed on one or more of a substrate, a solar cell, a cell fixator, a cell shield, and a sealant at a predetermined position. One or more of; an opposing fixed and resilient terminal is formed on a rabbet. Upon assembly, the glaze is placed within the glaze cup wherein the opposing terminals are now self-aligned and contact each other. The glaze is secured in position by a glazing bead interlocking with one or more of; a stile and rail and other fixation method such as mechanical locks, plastic welding, or fasteners.

In another embodiment, a method for blocking harmful blue light from a computer screen is disclosed. A transparent substrate covered with a specialized light responsive coating is utilized in front of a display screen to block blue light emitted through the substrate yet allowing visible light through. The display screen may be in the form of a computer monitor or other electronic device comprising a display screen. Unless blocked, the blue light over time can be harmful to a user's vision. The coating is again primarily a composition of organic salts that absorb wavelengths of infrared and ultraviolet light that are invisible to a human eye. In some forms, the organic salts are blends of cyanine and cyanine salts. Infrared and UV light from a display screen is trapped within the transparent coating and transformed into glowing infrared light that is guided to the edge of the glass or polymer where it is collected by solar cell strips adjacent an edge of the substrate to produce an electrical current. The electric current produced by the solar cell strips may be recycled to help reduce power consumption by the computer monitor or to drive other accessories connected to it. By blocking the harmful non-visible light, the coated substrate simultaneously helps protect the user's eyes.

BRIEF DESCRIPTION OF THE SEVERAL VIEWS OF THE DRAWINGS

These and other features and advantages of the present invention will become more readily appreciated when considered in connection with the following detailed description and appended drawings, wherein each drawing is according to one or more embodiments disclosed herein:

FIG. 6 is a perspective view of one embodiment of a glaze from use in a solar window further illustrating a solar cell terminal.

FIG. 7 is a partial close up perspective view of the solar cell terminal on a substrate introduced in FIG. 6 and illustrating an electrical conductor connecting it to a solar cell.

FIG. 8 is a partial close up perspective view of the solar cell terminal of FIG. 6 in relation to both panes.

FIG. 9 is a partial close up perspective view of the solar terminal of FIG. 8 with one pane removed.

FIG. 37 is a chart illustrating selected exit conductor travel location options on a solar window.

FIG. 38 is a chart illustrating selected terminal joiner location options on a solar window.

FIG. 41 illustrates one form of a window crank mechanism of the prior art.

FIG. 42 illustrates another form of a window cranking mechanism of the prior art.

FIG. 47 depicts a schematic view of an assortment of power, control, and sensing configurations that may be used in a window having one or more of an electrochromatic and transparent solar collector features in operable and fixed windows.

FIG. 47B depicts a schematic view of a glaze having a one or more transparent solar collector layers which powers one or more electrochromatic layers and having a control.

FIG. 48 depicts an end view of a multi-pane window having one or more of electrochromatic and transparent solar collector features.

DETAILED DESCRIPTION OF SELECTED EMBODIMENTS

Embodiments of the invention will now be described with reference to the Figures, wherein like numerals reflect like elements throughout. The terminology used in the description presented herein is not intended to be interpreted in any limited or restrictive way, simply because it is being utilized in conjunction with detailed description of certain specific embodiments of the invention. Furthermore, embodiments of the invention may include several novel features, no single one of which is solely responsible for its desirable attributes or which is essential to practicing the invention described herein.

Figure 1:
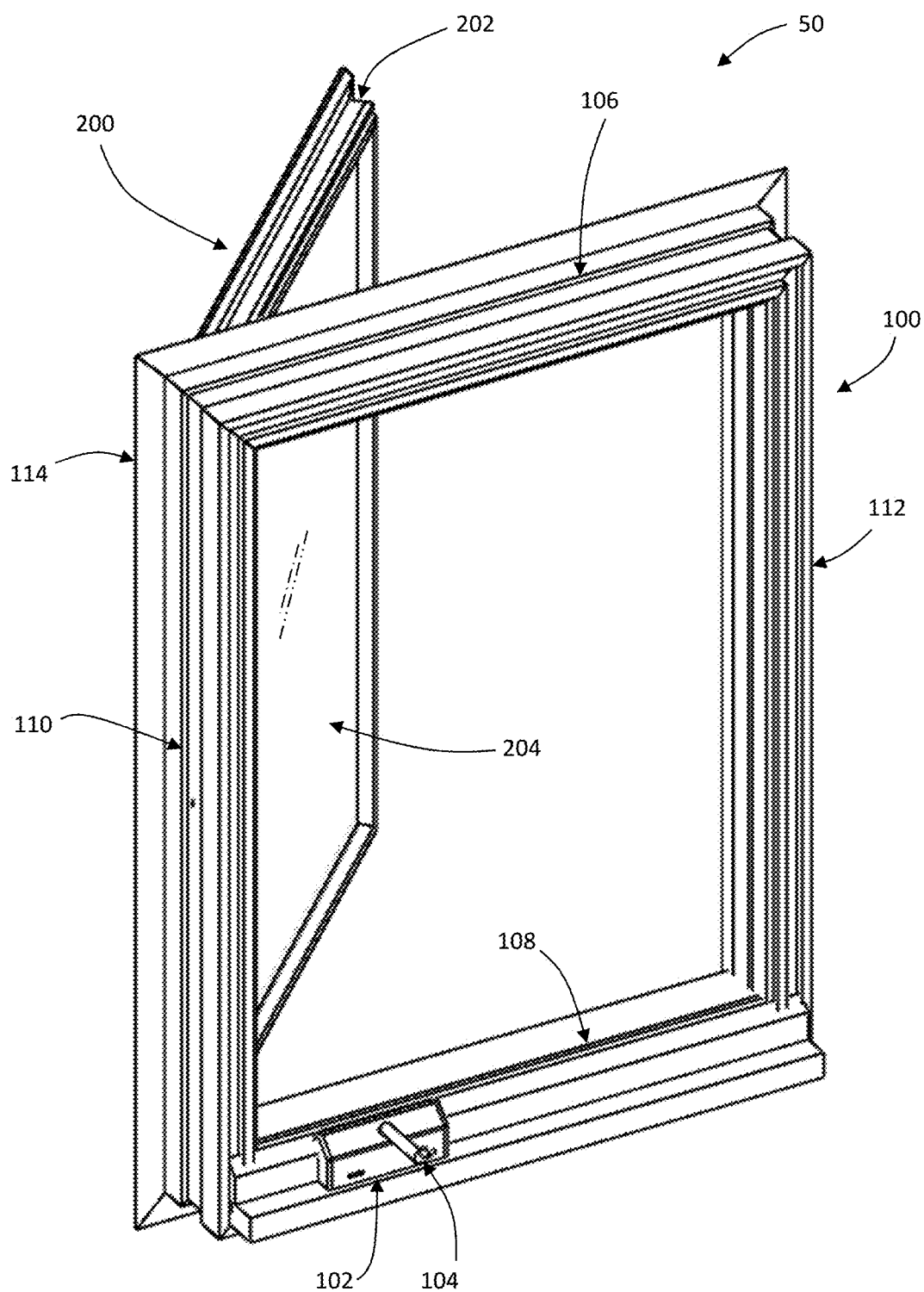
FIG. 1 is a perspective indoors view of a preferred embodiment of a solar collecting casement window with sash partially opened.
Figure 2:
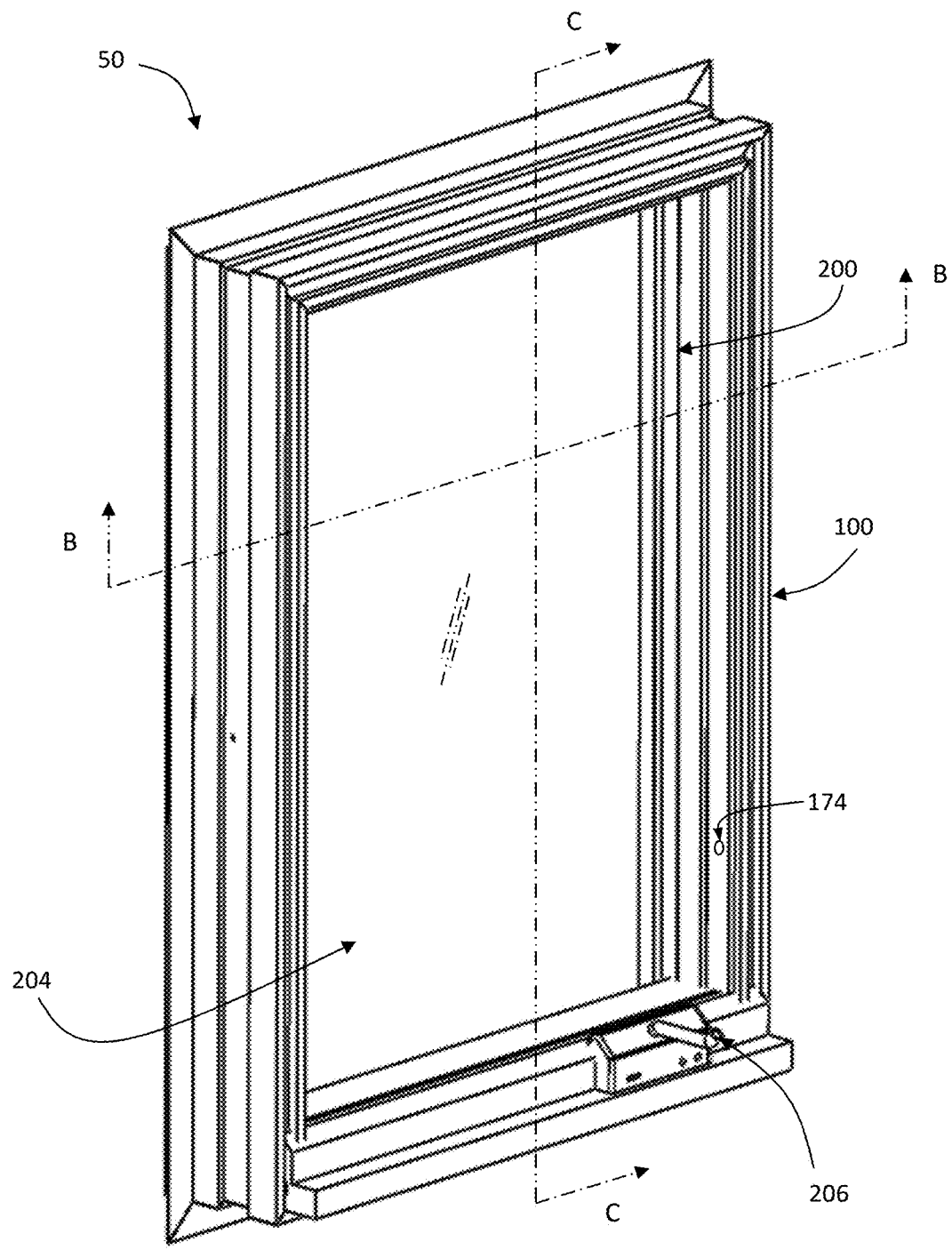
FIG. 2 is a perspective indoors view of the solar collecting casement window of FIG. 1 with sash closed.

In a preferred embodiment, the article of invention is in the form of a solar collecting casement window 50 and is illustrated in FIG. 1 (first sash 200 opened) and FIG. 2 (first sash 200 closed). The device comprises a solar collecting first glaze 204 held within a first sash 200. First sash 200 is pivotably connected to a window frame 100 by a hinge and linkage system available in the prior art with examples of such illustrated in FIGS. 41 and 42. In this embodiment, window frame 100 and scaffold assembly 202 is manufactured of a wood core 262 with an aluminum clad 254 and is manufactured from another materials such as vinyl or fiberglass in alternative embodiments. Window frames and scaffold assemblies utilizing materials having internal voids may have a portion of these spaces filled with insulation (i.e. foam) in preferred embodiments for improved insulation properties. An operator 104 on a crank mechanism causes linkage such as a crank arm to push first sash 200 out or pull it in towards window frame 100 depending on the direction in which operator 104 is turned.

Figure 3:
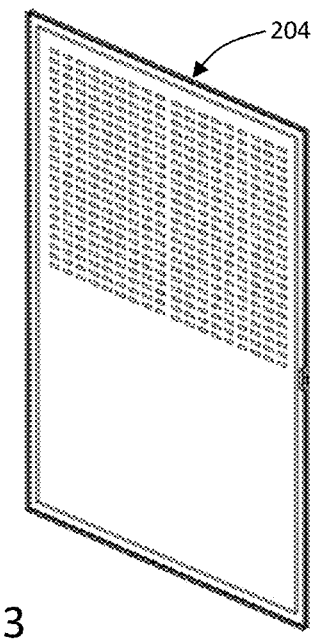
FIG. 3 is a perspective view of one embodiment of a glaze for use in a solar window.
Figure 4:
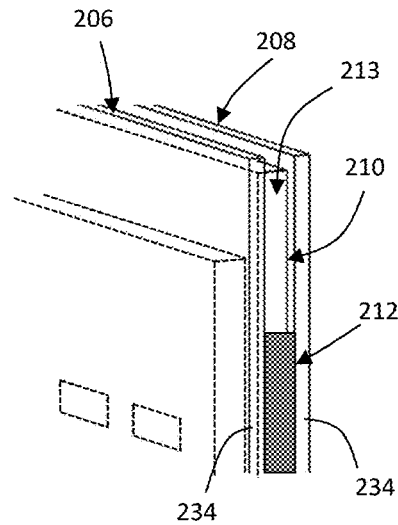
FIG. 4 is a partial close-up view of an edge of the glaze illustrated in FIG. 3 further illustrating its construction.
Figure 5:
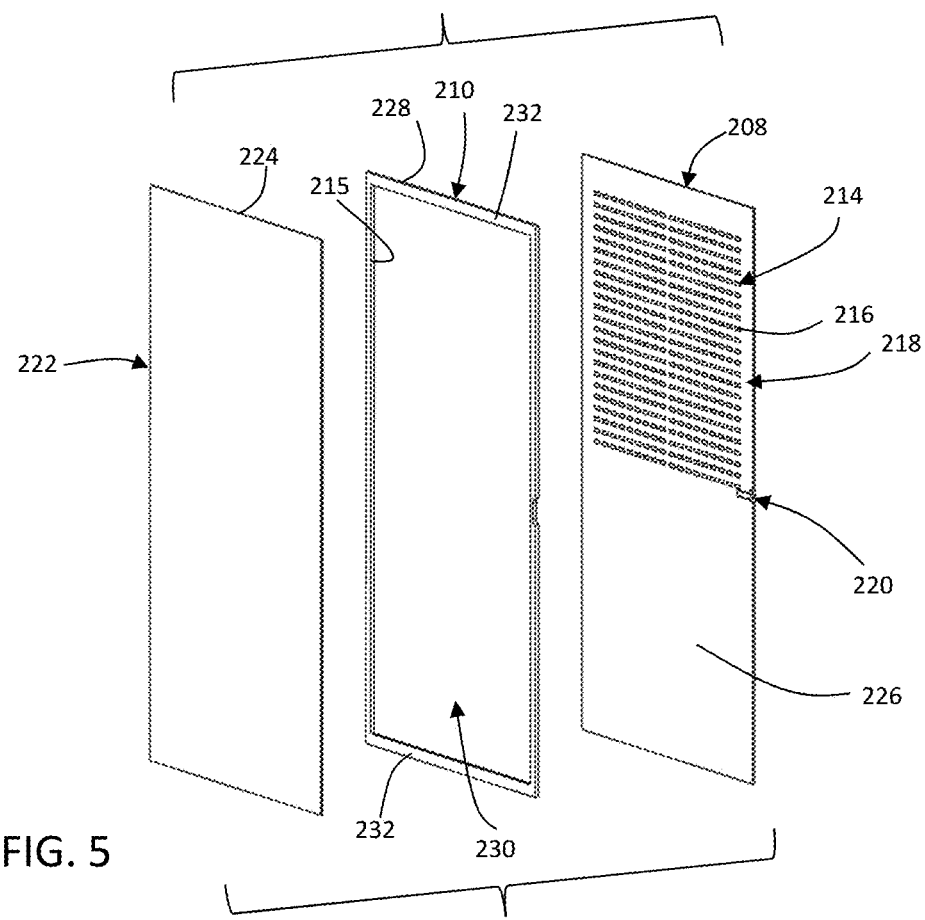
FIG. 5 is an exploded perspective view of one embodiment of a solar glaze having substantially transparent solar cells disposed on a surface of a pane.

Solar collecting casement window 50 comprises a first glaze 204 (FIGS. 3-5) formed from a proximal pane 206 and a distal pane 208 of a substantially transparent substrate such as glass although a polymer may be substituted. Pane 206, 208 are spaced by a spacer 210 creating an internal volume 230 therebetween panes 206,208. Proximal pane 206 is a pane positioned facing indoors whereas distal pane 208 is positioned facing outdoors. Internal volume 230 is defined by proximal internal face 224 of proximal pane 222 and distal internal face 226 of distal pane 208.

Formed on the internal face 226 of distal pane 208 are solar cells 216 that are substantially transparent and are created using thin layers of liquid coating on pane 208 to produce ultra-small solar cells in array groups 214. In this embodiment, the coating materials are organic polymers dissolved into liquid form. When applied to pane 208, solar modules appear with a neutral tint. In this form solar cells 216 and arrays 214 are created on the substrate to form a solar collector. In an alternative form, thin-film solar cells are printed using perovskites on glass or similar substrates in a multi-junction architecture. In alternative embodiments, solar cells are alternatively formed on other broad faces of distal pane 208 and proximal pane 206. To be inclusive of its various forms, solar collectors utilized herein are typically layers of film or coatings applied to a broad surface of a pane of glass and are alternatively referred to as a transparent solar collector layer or substantially transparent solar collector layer. In some embodiments, proximal pane 206 and distal pane 208 may be laminated together with one or more of a transparent solar collector layer and electrochromatic layer disposed therebetween.

Solar cell 216 in this embodiment includes a first face conductor 291 and a second face conductor 292 to provide an electrical conduit to a positive and negative solar cell terminal 220. Solar cell terminals 220 (FIGS. 7-9) in this embodiment are in the form of an enlarged metallic pad formed on the distal internal face 226 of distal pane 208. Solar cell terminals 220 may be copper and may wrap around the pane edge 234 of distal pane 208 and may even extend to the other side of the substrate. Displayed in FIG. 7 is a fixed terminal although in other forms the terminal may be resilient wherein solar cell terminal 220 may include a biased arm portion that deflects towards an opposing terminal for completion of a circuit. In other forms, a solar cell terminal may use other styles of electrical joiners introduced previously herein to create electrical connections.

A spacer 210 is inset from a pane edge 234 defining a sealing channel 213 extending around a circumference of spacer 210. Internal faces 224, 226 of proximal pane 206 and distal pane 208 and inside face 215 of spacer 210 defines inner volume 230. Once inner volume 230 is sealed, air in inner volume 230 is preferred to be replaced with Argon. A primary sealer 212 substantially fills sealing channel 213. A secondary sealer is used to seal between an internal face of a pane and opposing spacer side wall at secondary sealer app site 232. The sealant works to limit the leakage of air into the inner volume 230. A portion of spacer 210 may comprise a spacer recess 211 to provide additional access to solar terminals 220 as illustrated in FIG. 9.

Figure 10:
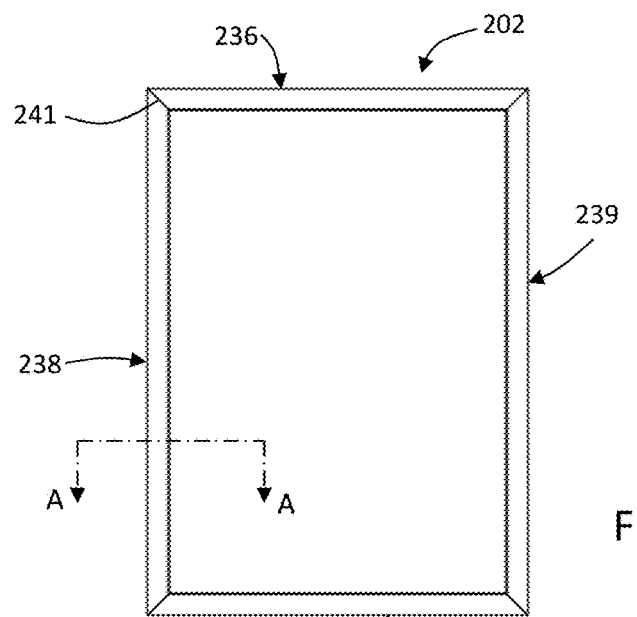
FIG. 10 is a rear (outdoor) view of a preferred embodiment of a scaffold assembly.

Illustrated in FIG. 10, one embodiment of a scaffold assembly 202 is formed of a combination of a first rail 236, a second rail 237, a first stile 238, and a second stile 239. The rails and stiles ends 241 are mitered at 45 degrees but may be trimmed at other angles in other embodiments. Alternatively the ends may be cut to interlock. The rails and stiles are fit and fixed together at their ends 241 to form a predetermined shape, such as a rectangle (FIG. 10), complementing the shape of a first glaze 204 used within. Rabbets 250 (FIG. 11-12) in each rail and stile together form a glaze cup 248 in which a first glaze 204 is seated.

Figure 11:
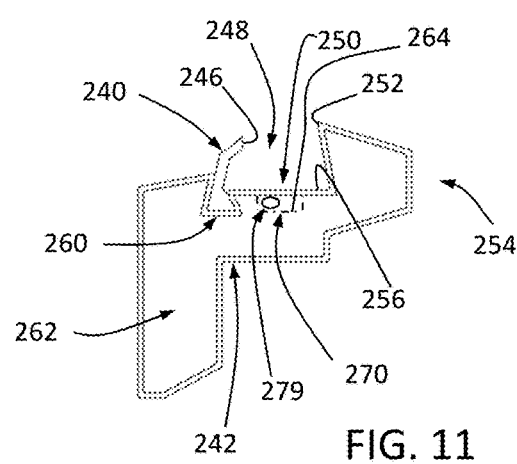
FIG. 11 is a cross-sectional view along A-A of the scaffold assembly of FIG. 10 illustrating the clad portion of a stile.
Figure 12:
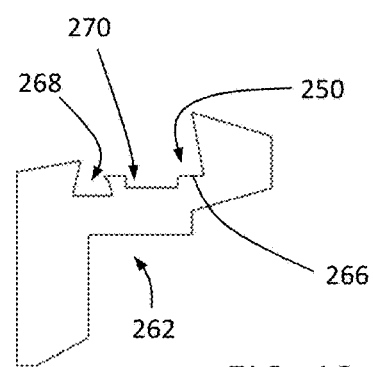
FIG. 12 is a cross-sectional view along A-A of the scaffold assembly of FIG. 10 illustrating the wood portion of a stile (includes illustration of an adjunct recess).
Figure 13:
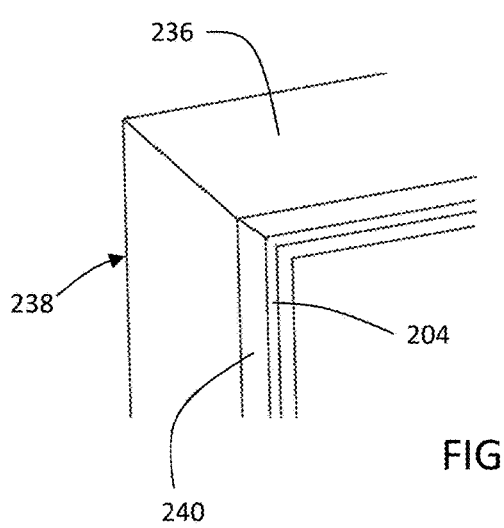
FIG. 13 is a partial rear view of a corner of the scaffold assembly of FIG. 10 illustrating the joining of a rail and stile.

A cross sectional view of one embodiment of a clad 254 and a wood core 262 across 'A-A' of a scaffold assembly 202 are illustrated in FIG. 11-12. In this embodiment, first rail 236, second rail 237, and first stile 238 and second stile 239 comprise this wood core 262 with outside cladding 254 of aluminum. A first glaze 204 is held and sealed between a first sealing edge 246 of glaze bead 240 and a second sealing edge 252 of a corresponding stile and rail. A scaffold floor 256 and a scaffold subfloor 264 (when present) faces an opposing pane edge 234 of a first glaze 204. Glaze bead 240 is secured within bead recess 260, 268. An adjunct recess 270 may be present to house one or more of; a sash portion of an exit conductor 279, edge placed solar cells, solar cell fixators, cell shields, and cell sealants. Clad 254 of FIG. 11 is illustrated with an adjunct recess 270 using construction lines (indicating if present) whereas wood core 262 illustrates an adjunct recess 270 feature.

Figure 14:
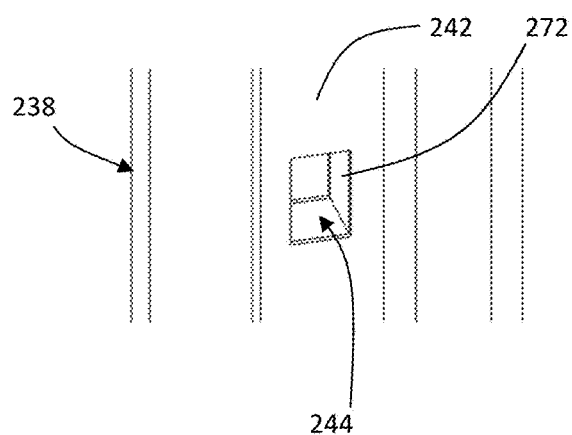
FIG. 14 is a partial close up perspective view of one embodiment of a sash port extending between a bridge wall and a scaffold floor.
Figure 15:
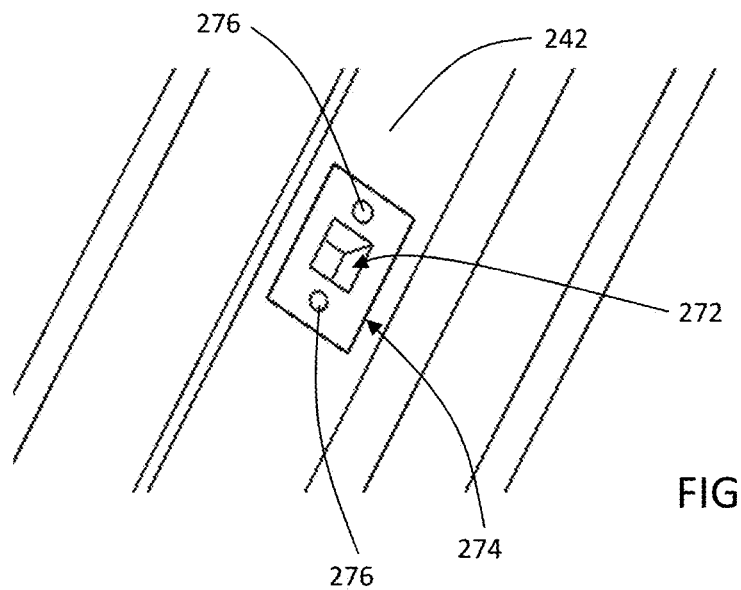
FIG. 15 is a partial close up perspective view of one embodiment of a sash port plug seated within a sash port for the transfer of current through the sash port.
Figure 16:
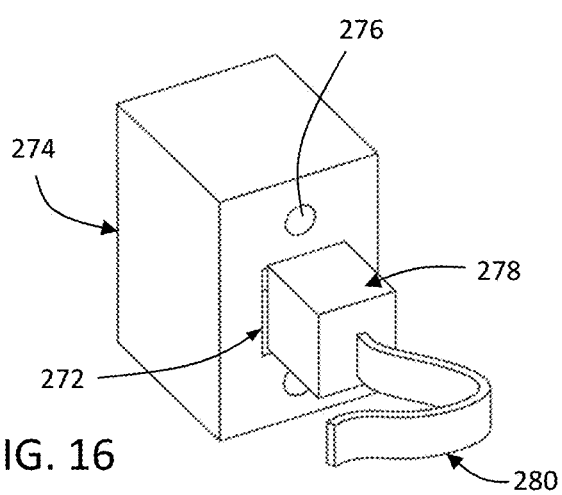
FIG. 16 is a partial perspective view of one embodiment of a sash port plug with an bridge portion end connector preparing for seating.
Figure 17:
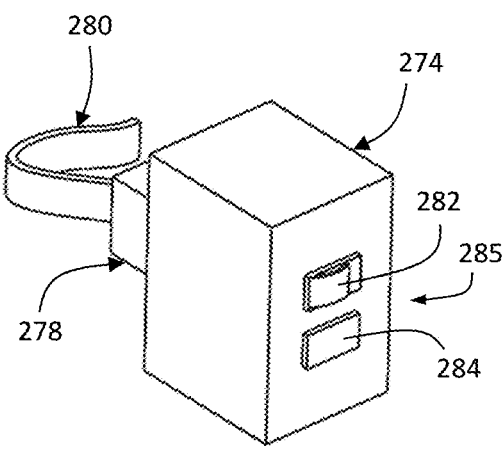
FIG. 17 is a partial perspective view from an opposed angle of the sash port plug of FIG. 16 illustrating two types of terminals which may be used.
Figure 18:
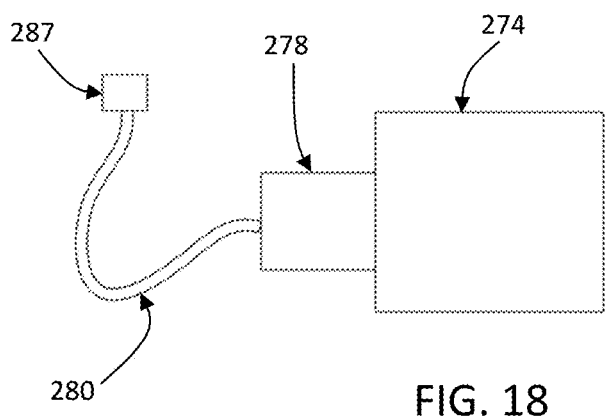
FIG. 18 is a side view of one embodiment of a sash port plug with bridge portion end connector and bridge portion of an exit conductor extending to a frame port plug.

A sash port 244 (FIG. 14) extends between scaffold floor 256 (or scaffold subfloor 264) and a bridge wall 242 on a first stile 238. In this embodiment, sash port 244 is substantially rectangular but may be configured to a variety of shapes such as circular. An electrical joiner is used between solar cell terminal 220 and a sash portion of an exit conductor 279 and is here in the form of positional contact interference. Incidence to placing first glaze 204 in glaze cup 248, solar cell terminals 220 engage opposing positive and negative terminals in rabbet 250 extending from sash port coupler 274 (FIG. 15-17). As illustrated in the FIG. 17 embodiment, sash port entry terminals 285 may be in the form of one or more of fixed terminals 282 and resilient terminals 284.

On an opposing end of sash port coupler 274 is a plug receiver 272 for housing an end connector of a bridge portion of exit conductor 280 here illustrated as sash port plug 278. Complementary contacting terminals within sash port plug 278 and within sash port plug receiver 272 provides for the transfer of electrical current from solar collector 218 through bridge portion of the exit conductor 280. The body of sash port coupler 274 is held in sash port 244 by one or more of the following techniques such as fasteners place through fastening holes 276 and adhesives. Sash port plug 278 is removably held in plug receiver 272 by a deflectable arm (not shown) that deflects into a lock recess in plug receiver 272 similar to a RJ-11 phone jack.

Figure 21:
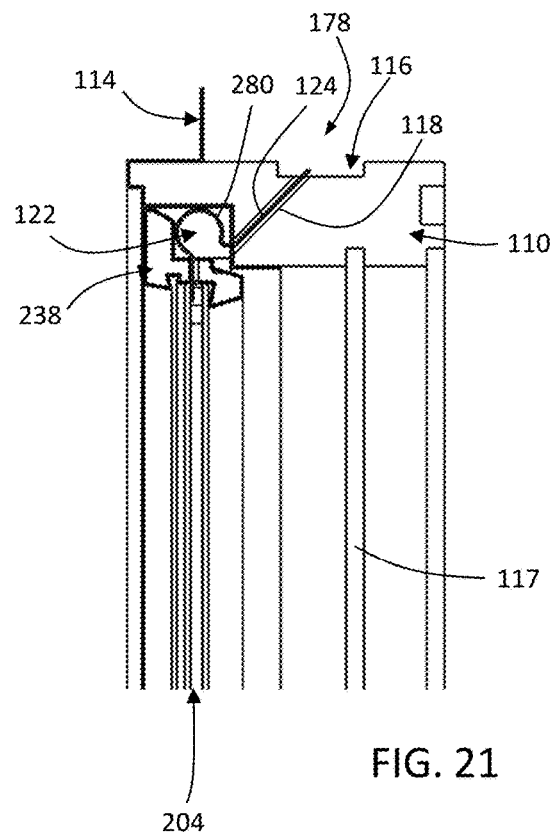
FIG. 21 is a partial close up cross sectional view along B-B of the solar window illustrated in FIG. 2 illustrating one embodiment of a flexible bridge portion within a chest cavity with sash closed.
Figure 22:
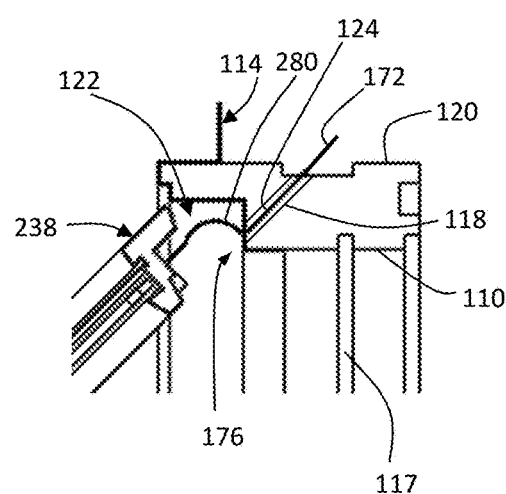
FIG. 22 is a partial close up cross sectional view along B-B of the solar window illustrated in FIG. 2 illustrating one embodiment of a flexible bridge portion within a ches cavity with sash opened.
Figure 23:
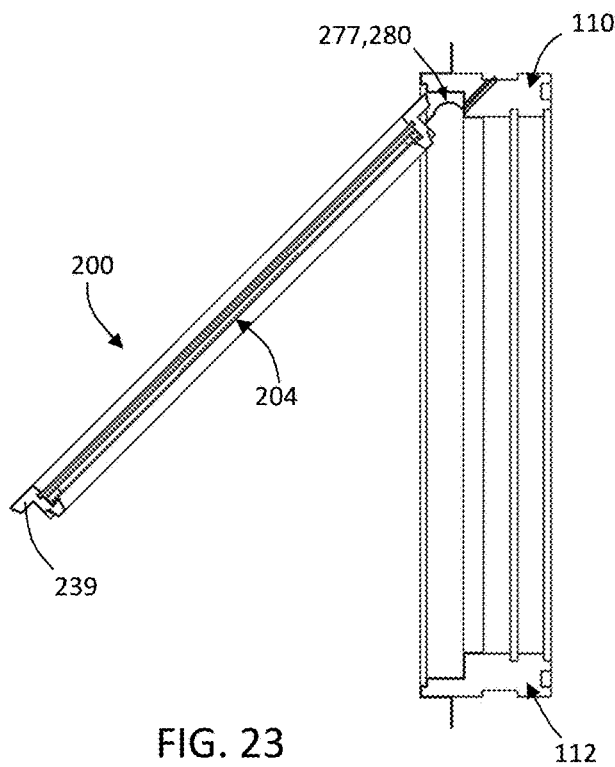
FIG. 23 is a full cross sectional view of the embodiment illustrated in FIG. 22.

In this embodiment (FIG. 20-23), bridge portion of exit conductor 280 is in the form of a flexible sheet with positive and negative conductor layers on a side of the sheet. As disclosed earlier, a conductor on a flexible sheet may be formed as a printed circuit board. The printed circuit board may comprise polyimide. An insulator layer prevents direct exposure to bridge portion of exit conductor 280. In this embodiment, bridge portion of exit conductor 280 is housed within a chest cavity 122 formed between a scaffold assembly 202 and frame 100 of a casement solar window 50. In some forms the bridge portion flexible sheet may be biased into a predetermined shape capable of alternating between a compact configuration when sash is closed and an elongate configuration when sash is open. For example, the flexible sheet may have an accordion like profile. Alternatively in a preferred embodiment and as seen in FIG. 21-22, flexible sheet of 280 is in the general shape of a semi-circle that fits within a chest cavity 122. With first sash 200 closed, bridge portion of exit conductor 280 maintains a compact configuration. As first sash 200 is opened, the semi-circular shape of bridge portion of exit conductor 280 opens and elongates to an elongate configuration therein limiting stress imposed on the exit conductor. This is further demonstrated in the sectional views of FIGS. 20 to 23.

Figure 19:
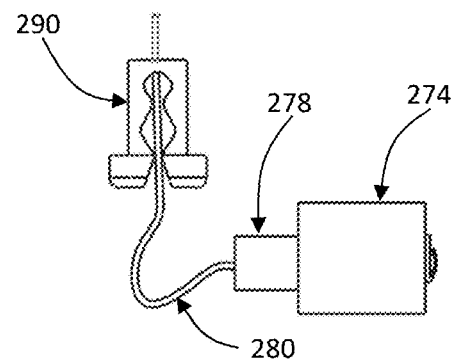
FIG. 19 is a side view of one embodiment of a sash port plug with bridge portion end connector and bridge portion of an exit conductor extending through a frame port clamp.
Figure 20:
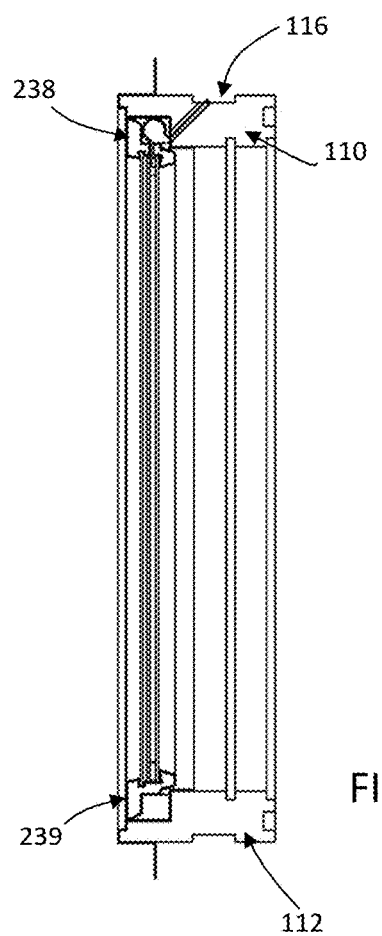
FIG. 20 is a cross sectional view along B-B of the solar window illustrated in FIG. 2.

Upon exiting chest cavity 122, bridge portion of exit conductor 280 continues towards an entry of a first frame port 118. The entry or exit of first frame port 118 may comprise an electrical joiner. For example, a receiver and plug type device (frame port plug 287) similar to sash port plug 278 and plug receiver 272 may be used as a releasable connection between bridge portion of exit conductor 280 and window frame portion 100. In other forms an exit conductor is not releasable at an entry of first frame port 118. In alternative forms, the exit conductor may be secured in an entry of first frame port 118 for example by one or more of; a sealant, an adhesive, and a compression grommet 290 as illustrated in FIG. 19. Compression arms on grommet 290 flex against a bridge portion of the exit conductor 280 to fix it in place.

In the illustrated embodiment (FIG. 22), a frame portion of the exit conductor 124 extends through frame port 118 and exiting out at a lateral face 120 of window frame 100. From here a functional end of exit conductor 172 is routed toward a solar circuitry system of the building structure. In alternative embodiments exit conductor 277 may instead extend down an outside extension channel 116 in window frame 100 until reaching an access window 174. At access window 174 (FIG. 2), functional lead of exit conductor 172 may be used to provide power to electronic accessories. A joiner may be located at one or more of; a frame port exit, at access window 174, or anywhere in therebetween. Joiners may be used for the joining of exit conductor 277 to leads extending from the building's solar system. Interruptions within an exit conductor at sites of joiners may vary. In one embodiment for example, exit conductor 277 may be absent of joiners thereby extending directly from solar cells 216 within a first glaze 204 through a functional end of exit conductor 172. In alternative embodiments, exit conductor 277 may include a plurality of joiners providing the installer multiple sites to connect into a solar window's electrical system.

Figure 24:
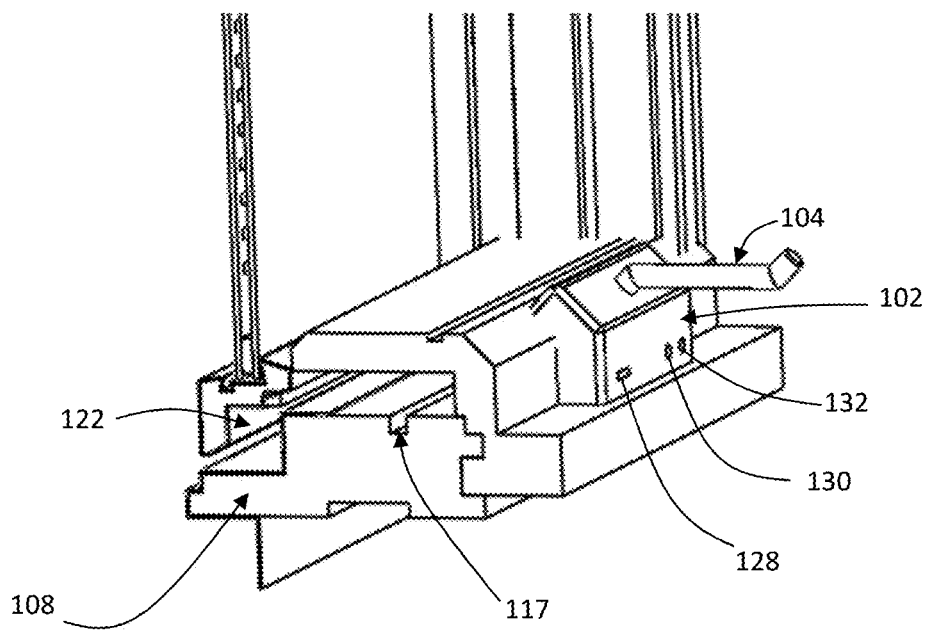
FIG. 24 is a cross sectional view along C-C of the solar window illustrated in FIG. 2 illustrating various channels and cavities which may be used for solar circuitry.
Figure 25:
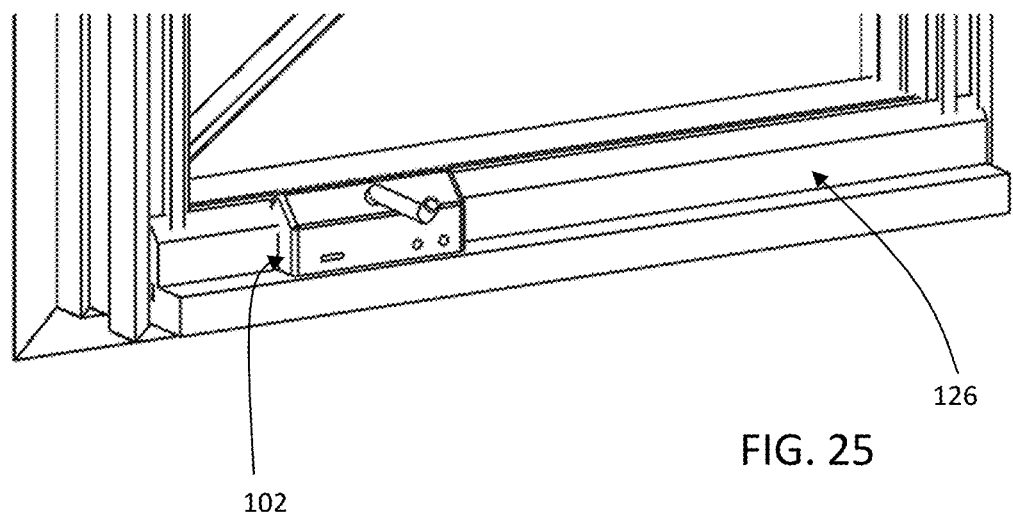
FIG. 25 is a partial indoor perspective view of a window crank cover with various integrated electrical ports.

In alternative embodiments, at least a branch of exit conductor 277 travels an interior frame path before one or more of; exiting through a frame port 118, traveling to an access window 174 to provide power, and traveling to a crank cover 102. For example, exit conductor 277 may travel in inner extension channel 117 which is typically hidden behind or within removable decorative frame molding at the inside of window frame 100. The exit conductor 277 may then be routed toward an access window 174 where it can be attached to one or more of; electronic accessories, integrated batteries in a battery cavity, a window crank cover (FIG. 24-25), and one or more power electrical ports and other outlets. Alternatively, exit conductor 277 may travel within a chest cavity 122 of a window. Fasteners and adhesives may be used to secure the exit conduct at predetermined positions within a chest cavity or within an inner extension channel 117.

In one embodiment an electric driven motor 356 is housed behind a crank cover 102 to rotate an operator 104 and open and close a first sash 200 by pushing corresponding buttons 132 on crank cover 102. Current to drive the motor is supplied from solar collector 218 or from on-board batteries stored within a battery cavity of the window or both. In some embodiments, an electric driven motor responds to one or more temperature and humidity sensors such that solar window 50 will automatically open when a room reaches a pre-determined in-door temperature and close when a window senses rain. In some embodiments, the driven motor responds to an indoor-outdoor temperature differential wherein a window will only be automatically opened when the differential is advantageous to a user (i.e. outside air temperature is low enough to help cool a hot room).

Figure 27:
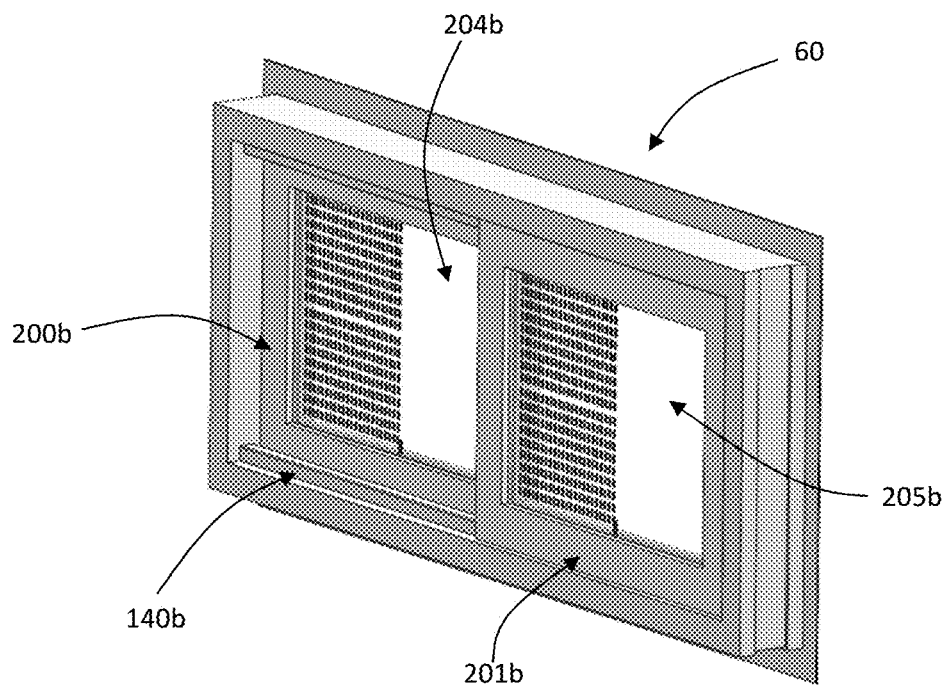
FIG. 27 is an indoor perspective view of one embodiment of a solar window in a sliding configuration.
Figure 32:
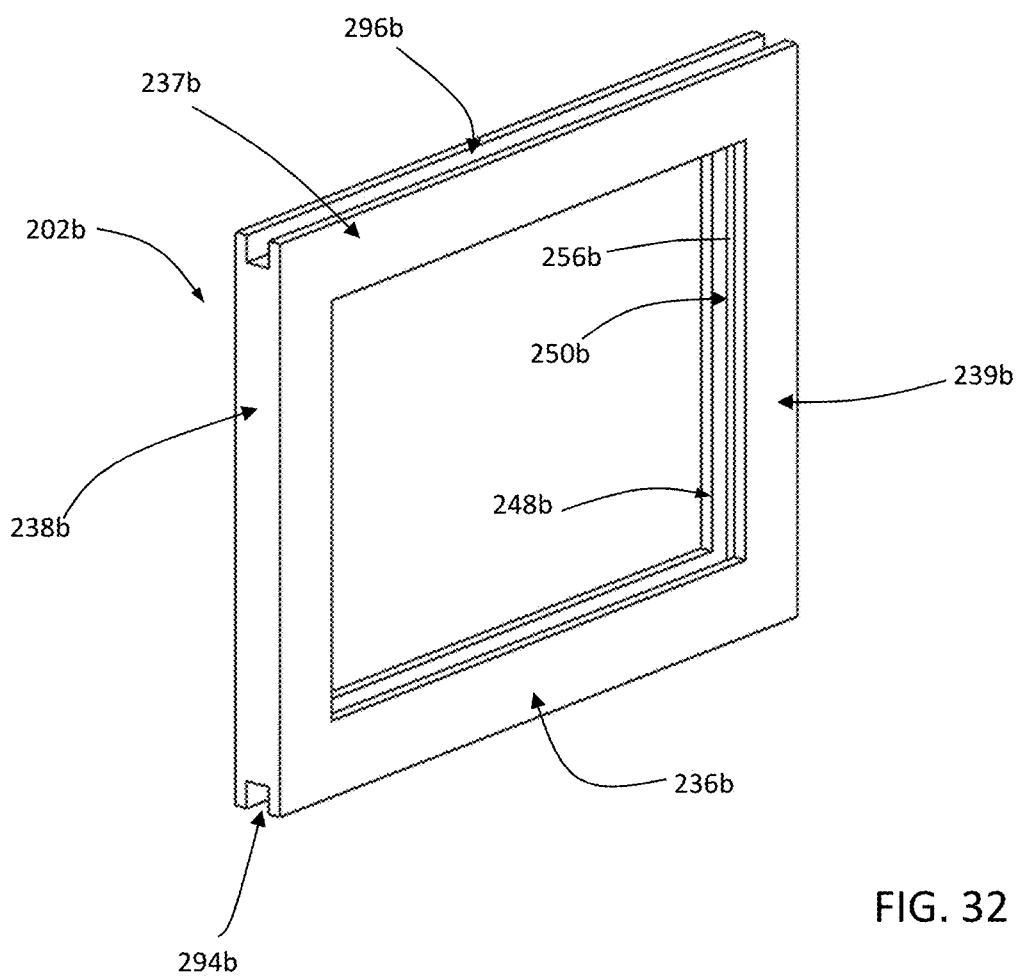
FIG. 32 is a perspective view of one embodiment of a scaffold assembly of a sliding window used to house a solar collecting glaze.

FIG. 27 illustrates yet another embodiment of a transparent solar energy producing window in the form of a sliding solar window 60. In some forms, embodiments of window 60 are turned 90 degrees and operate as a hung or double hung style window. Various solar glaze construction techniques such as those described previously (i.e. FIG. 3-5) may be used for solar sliding style and solar hung windows. For example, a generally transparent solar collecting first glaze 204 (illustrated previously in FIG. 3) may be dimensionally modified and seated within rabbet 250*b* within scaffold assembly 202*b* (FIG. 32).

Figure 28:
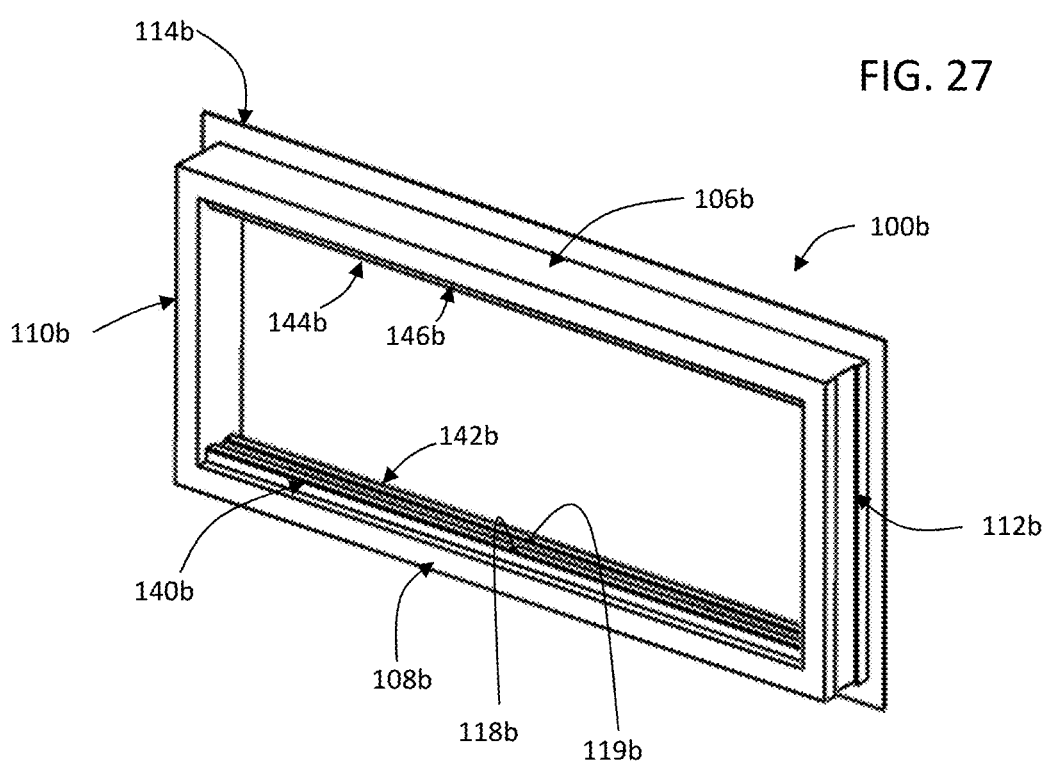
FIG. 28 is an indoor perspective view of one embodiment of a solar window frame.

FIG. 28 illustrates an embodiment of a window frame 100*b* wherein this embodiment is manufactured from a header 106*b*, a sill 108*b*, a first jamb 110*b*, and a second jamb 112*b*. This embodiment includes an optional nailing fin 114*b* although like other windows disclosed, window frame 100*b* may be formed of a block frame form or a flush flange.

Figure 30:
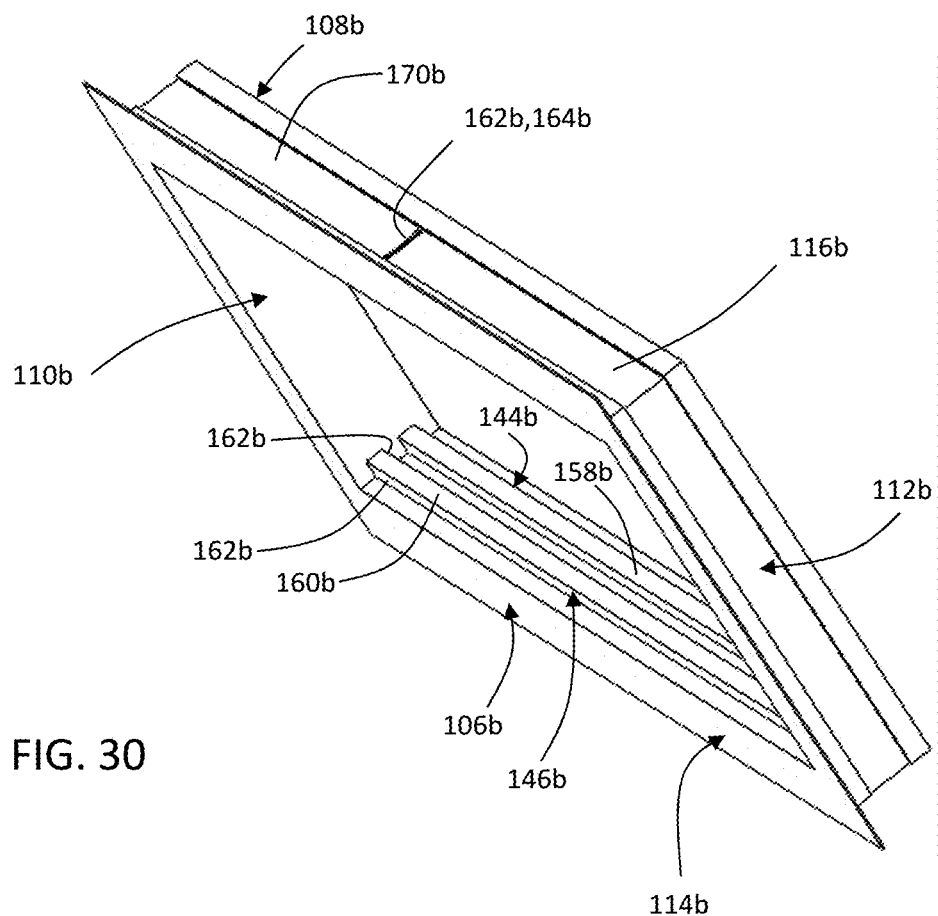
FIG. 30 is a top perspective view of the solar window frame of FIG. 28 illustrating various guide surfaces and frame port exits.

As illustrated in FIGS. 28 and 30, a third slide boss 144*b* and a fourth slide boss 146*b* are positioned along an inside portion of header 106*b*, and a first slide boss 140*b* and a second slide boss 142*b* are positioned along an inside portion of sill 108*b* to offer side to side guided sliding of each sash. For hung windows slide bosses are alternatively positioned vertically along first jamb 110*b* and second jamb 112*b*. Each slide boss is shaped to complement corresponding scaffold guide grooves 294*b*, 296*b* typically using a tongue and groove arrangement. A slide boss extends from rails on a sliding window for horizontal movement, and from stiles on a hung window for vertical movement to guide linear movement of each sash for open and closing operation. Alternatively, in either configuration (hung or sliding), an elongated guide boss may be alternatively formed on a form of slide liner, such as a jamb liner that fits between a jamb and sash. For horizontal sliding windows a header liner and sill liner would be used.

Figure 29:
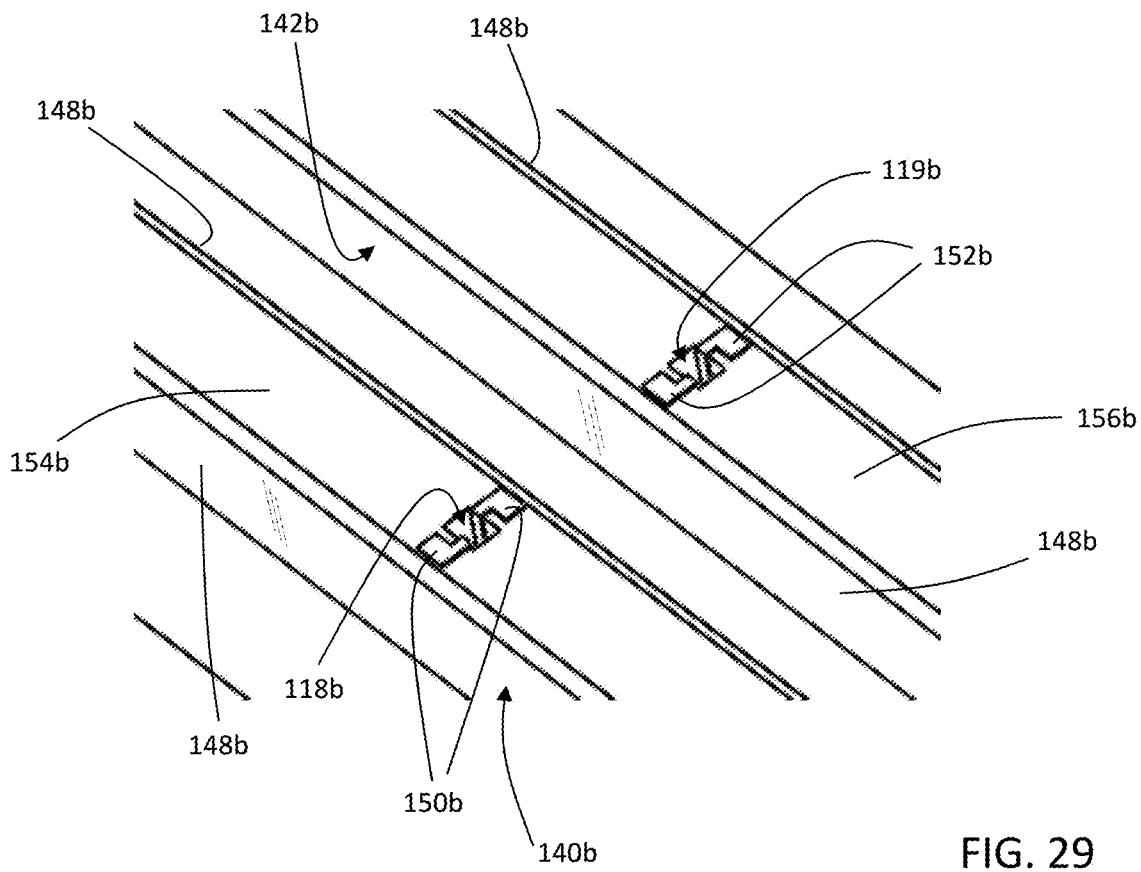
FIG. 29 is a partial close up perspective view of one embodiment of a contact terminal arrangement on elongate guide bosses of a window frame.
Figure 31:
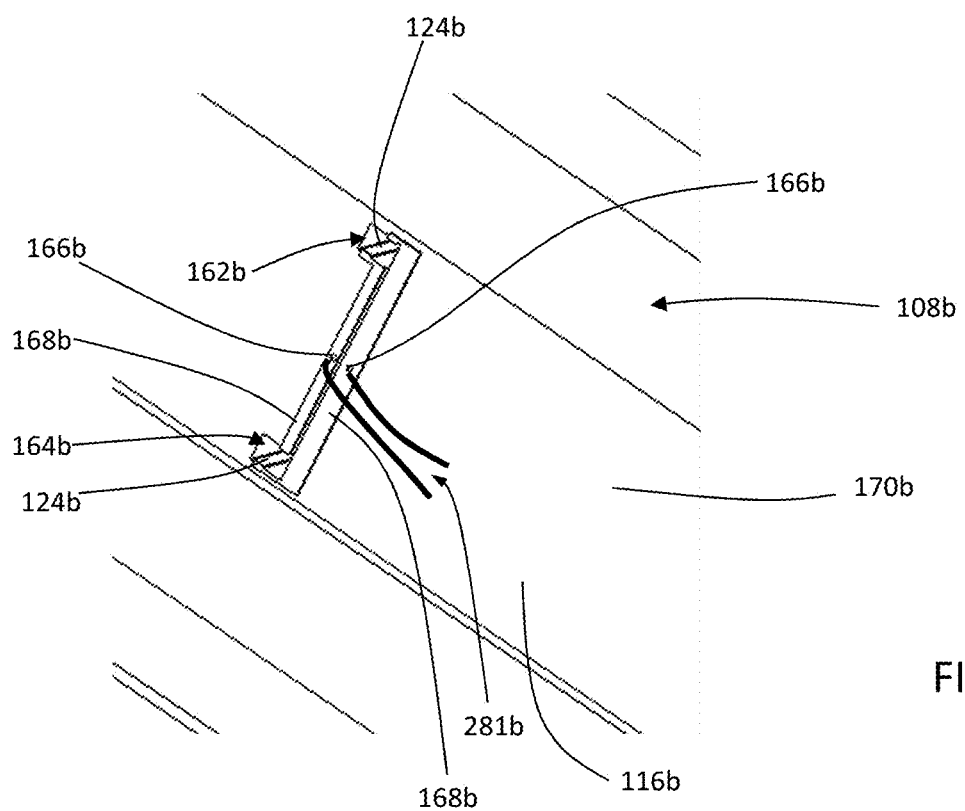
FIG. 31 is a close up perspective view of one embodiment of a frame port exiting an outside surface of a frame sill of a sliding solar window.

At least one frame port is utilized as a passage for an exit conductor to transfer electrical current from one or more of solar collectors formed on a first glaze 204*b* and a second glaze 205*b* to a point outside window frame 100*b* such as to an inverter of a home solar system. The position of a frame port preferably is located adjacent a scaffold port, however this is not necessary as an exit conductor may travel a path along the frame, liners or sash to a different port entry site. In this embodiment (FIG. 28-29) a frame port is in the form of a first frame port 118*b* and a second frame port 119*b* generally centered sill 108*b*. (Alternatively, a liner port may be present to pass the exit conductor in the event a slide liner is used.) In this embodiment, first frame port 118*b* and second frame port 119*b* extend down through corresponding first primary guide surface 154*b* of first slide boss 140*b* and second primary guide surface 156*b* of second slide boss 142*b* towards an outer frame surface 170*b* of sill 108*b*. Alternatively, first frame port 118*b* and second frame port 119*b* may extend from surfaces other than primary guide surfaces. For example, the frame port may extend from a side guide surface 148*b*. In some embodiments, conductors from each sash are routed through a single frame port. Here, a first terminal pair 150*b* and a second terminal pair 152*b* are electrically coupled with a lead end of frame portion of an exit conductor 124*b* (FIG. 31). First terminal pair 150*b* and second terminal pair 152*b* are a form of electrical joiner. In this embodiment (FIG. 29) terminal pair 150*b* and 152*b* are disposed on a guide surface of a corresponding slide boss. Negative and positive terminal pairs of exit conductor 124*b* are separated for alignment with opposing first elongate contact terminal 300*b* and second elongate contact terminal 302*b* formed on a base surface 304*b* of a scaffold guide guide groove 294*b*. One or more of an adhesive and fastener may be used to hold contact terminals and frame terminals and other portions of an exit conductor in position.

Figure 29A:
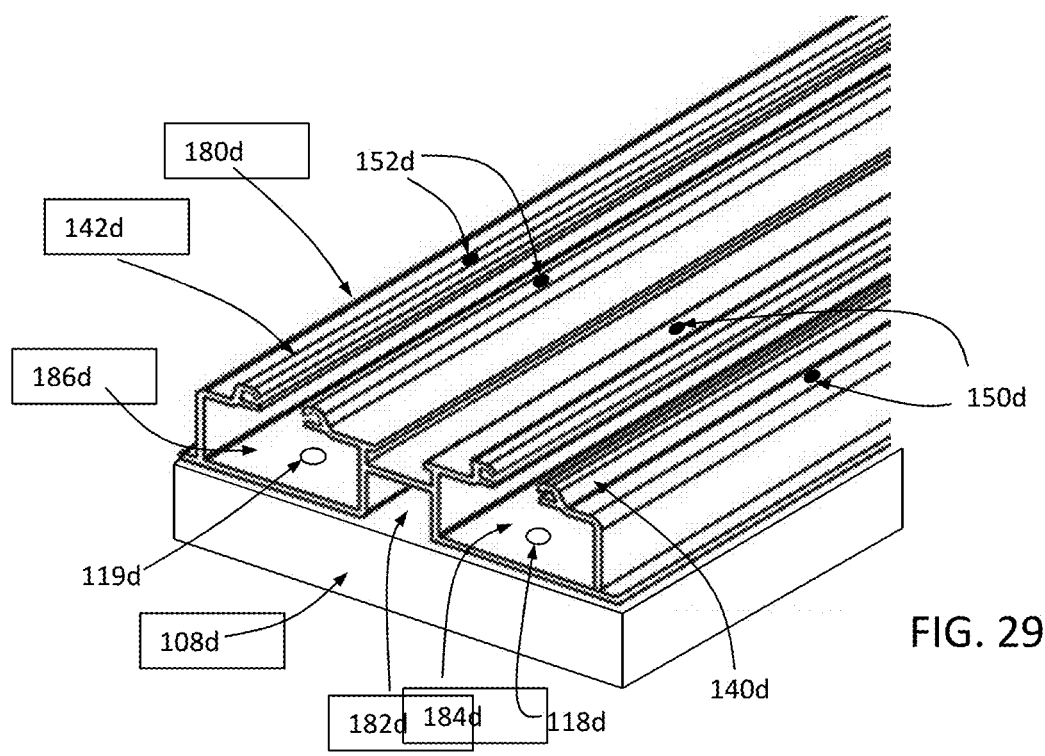
FIG. 29A is a perspective view of one embodiment of a liner (jamb, sill, head) situated between a frame portion and a sash portion.

FIG. 29A illustrates an example of a liner (jamb, head, sill) for use between sliding surfaces of a sash 200*b* and a window frame 100*b*. In this embodiment, liner 180 comprises a first slide boss 140*d* and a second slide boss 142*d* for engaging scaffold guide grooves of a scaffold assembly 202*b* pair in a sliding or hung window. Formed on each slide boss is a first frame terminal pair 150*d* and a second frame terminal pair 152*d* which are functionally equivalent to the terminal pairs illustrated in FIG. 29. The terminal pair may be positioned at various locations on a surface of a slide boss or adjacent to it as illustrated by the narrow position of second frame terminal pair 152*d* with respect to the wide position of first terminal pair 150*d*. Exit conductors extending from each terminal pair may travel within any of first liner tunnel 182*d*, second liner tunnel 184*d*, and third liner tunnel 186*d*, before descending through first frame port 118*d* and second frame port 119*d* to reach an outer frame surface 170*b*. Typically liner are made of polymers for reduced friction.

In one embodiment, FIG. 31 illustrates a close up view of a first frame port exit 162 and a second frame port exit 164 through an outer fame surface 170*b* of window frame sill 108*b*. A frame portion of an exit conductor 124*b* extends through a first frame port exit 162*b* and a second frame port exit 164*b* and like poles are joined together to combine the electrical current from each sash (200*b*, 201*b*). In this embodiment, the exits 162*b*, 164*b* of the frame port open in an outer extension channel 116*b* on an outer perimeter of window frame 100*b*. In this embodiment a joiner is included in the form of fastening holes 166*b* wherein an extension portion of an exit conductor 277*b* may be joined using fasteners at fastening holes 166*b*. Alternatively, an extension portion of an exit conductor 277*b* may be joined using other joiner methods such as plugs, spring clips, soldering and other methods previously discussed. In some embodiments, exit conductor 277*b* may travel down outer extension channel 116*b* to a final destination such as to connect with a building structures solar energy system. One or more of; staples, wire fasteners, and adhesives may be used to hold the exit conductor in an extension channel.

Previous descriptions in this application for casement window exit conductor frame routing options extend also to hung and sliding windows styles (except where crank covers are concerned). In light of this, exit conductors in hung and sliding style solar windows subject to this application may also be routed to achieve previously described features. For example, an accessory access window extending through a frame 100*b* may be used to provide one or more of; power to USB ports, power to charge batteries, and charging ports for accessory devices to name a few.

FIG. 32 illustrates one embodiment of a scaffold assembly 202*b* for a use in a sliding or hung style solar window 60. A first scaffold guide groove 294*b* and a second scaffold guide groove 296*b* extend across opposing edges of the scaffold assembly 202*b*. A rabbet 250*b* is formed in each stile and rail. A glaze cup 248*b* is formed in scaffold assembly 202*b* using a glaze bead 240 and bead recess 260 arrangement as described and illustrated in FIG. 11 capturing first glaze 204*b* and second glaze 205*b* within respective first sash 200*b* and second sash 201*b* (FIG. 27). Other forms of solar collecting glaze may be used such as a glaze comprising a pane edge positioned solar cell. The pane edge solar cell collects light directed from a non-visible light sensitive coating on the pane.

Figure 33:
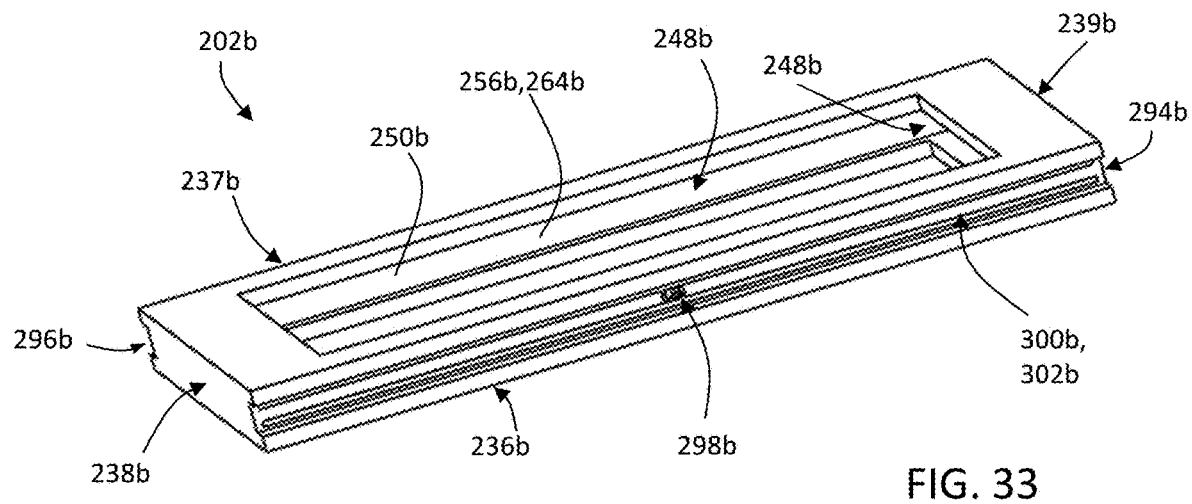
FIG. 33 is a side perspective view of one embodiment the scaffold assembly of FIG. 32 illustrating elongate contact terminals and a scaffold port.

FIG. 33 overs a different view of the scaffold assembly of FIG. 32 which may be used for both sliding and hung style windows. Scaffold assembly 202*b* comprises a first stile 238*b* opposed by a second stile 239*b* with a first rail 236*b* opposed by a second rail 237*b*. In some embodiments the stiles and rails are individual parts assembled into a scaffold assembly. Extending the entire length of first rail 236*b* is first scaffold guide groove 294*b*. Scaffold port 298*b* is defined by scaffold port face 299*b* and extends between base surface 304*b* and one or more of; scaffold floor 256*b* and scaffold subfloor 264*b* (if present). Extending along first scaffold guide groove 294*b* is first elongate contact terminal 300*b* and second elongate contact terminal 302*b* so positioned so as to maintain sliding contact with first frame terminal pair 150*b* on corresponding guide surfaces of a window frame or liners there between. Electrical contact between an elongate contact terminal and a terminal pair provides for the transfer of energy from a solar collecting sash 200b, 201b to points within a window frame 100b.

Figure 34:
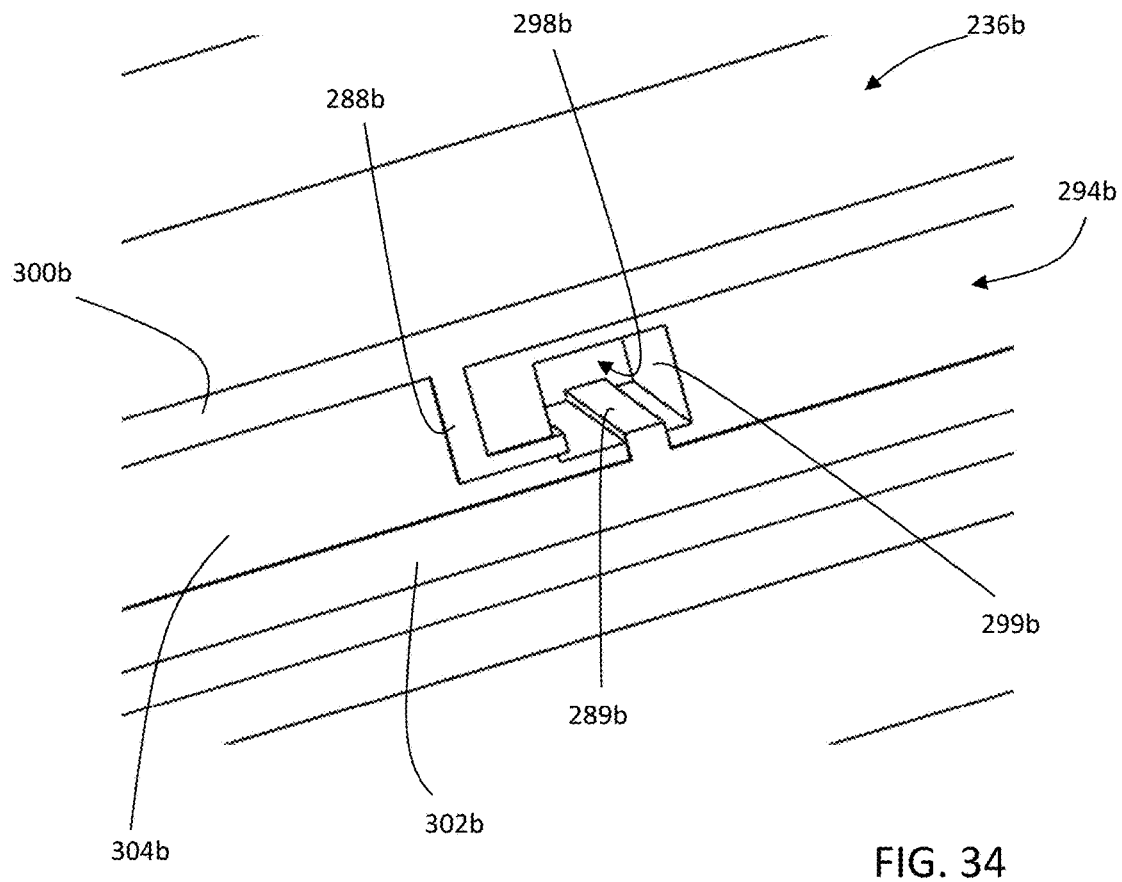
FIG. 34 is a close-up view of the elongate contact terminals and scaffold port exit of FIG. 33.

FIG. 34 illustrates in close up a scaffold port 298b extending between a scaffold floor 256b of a rabbet 250b and a base surface 304b inside a first scaffold guide groove 294b. Formed along base surface 304b are first elongate contact terminal 300b and second elongate contact terminal 302b. These terminals 300b, 302b extend from first terminal leg 288b and second terminal leg 289b of sash portion of exit conductor 279b which travels through scaffold port 298b toward rabbet 250b. The elongate contact terminals are positioned for sliding contact engagement with first frame terminal pair 150b and second terminal pair 152b disposed on primary guide surfaces 154b, 156b of first and second slide boss 140b, 142b. This cooperating arrangement ensures the solar circuit remains closed despite repositioning of the sash within the window frame. First and second frame port 118b, 119b may be sealed with one or more of a plug and a sealant.

Figure 35:
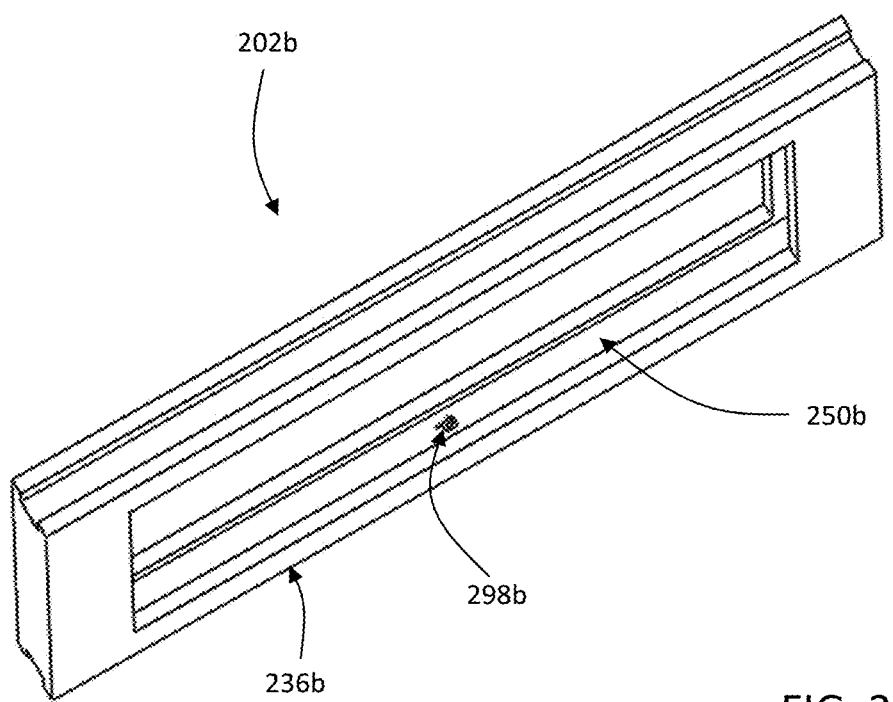
FIG. 35 is a perspective view of the scaffold assembly illustrated in FIG. 32 illustrating location of an entry of a scaffold port.
Figure 36:
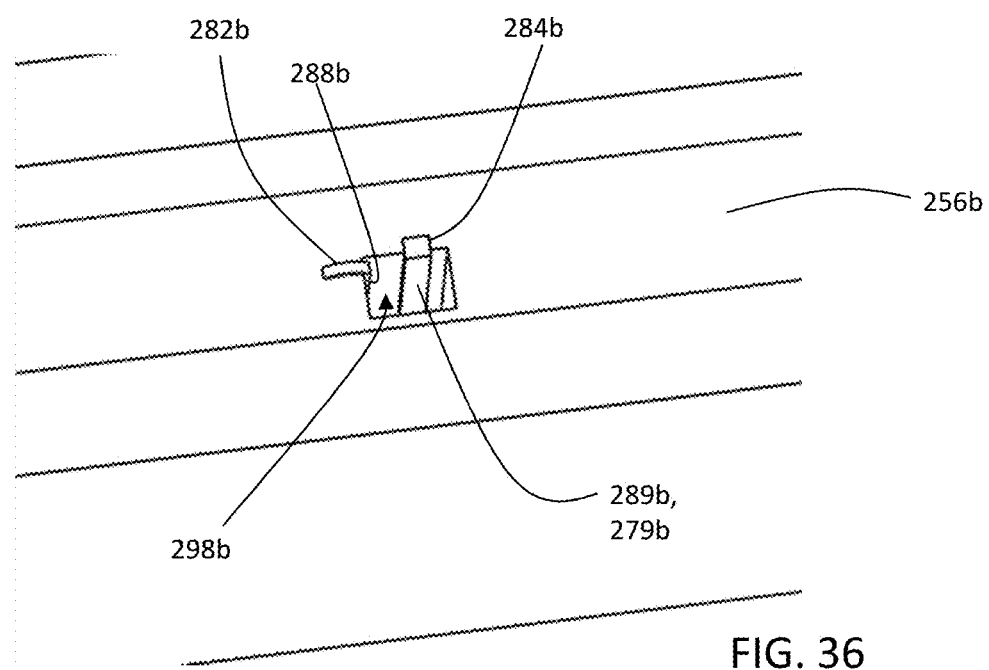
FIG. 36 is a close up view of the scaffold port entry of FIG. 35.

FIGS. 35 and 36 illustrate a scaffold assembly 202b with a close-up view of the entry side of scaffold port 298b. Here a sash portion of exit conductor 279b extends through scaffold port 298b. Contact terminals extend across scaffold floor 256b of rabbet 250b. In this embodiment, both a first terminal leg 288 and a second terminal leg 289 are curved so as to be biased toward opposing solar terminals on a glaze 204b, 205b. When a glaze 204b, 205b is lowered into glaze cup 248b, the resilient terminals flatten as necessary for fit but also to assure continuous contact between the opposing terminal surfaces.

FIG. 37 illustrates some of several paths that an exit conductor may travel as it makes its way through portions of a solar window assembly towards a functional destination.

FIG. 38 illustrates some of several possible locations at which terminal joiners may be located to join various portions of an exit conductor. The chart indicates the placement of a terminal joiner between two portions of an exit conductor. An exit conductor is typically electrically insulated as it travels its course and includes a positive and a negative conductor contained within it. Some embodiments are absent of joiners such as when an exit conductor extends directly from a solar cell, and moves through a sash and frame.

Figure 26:
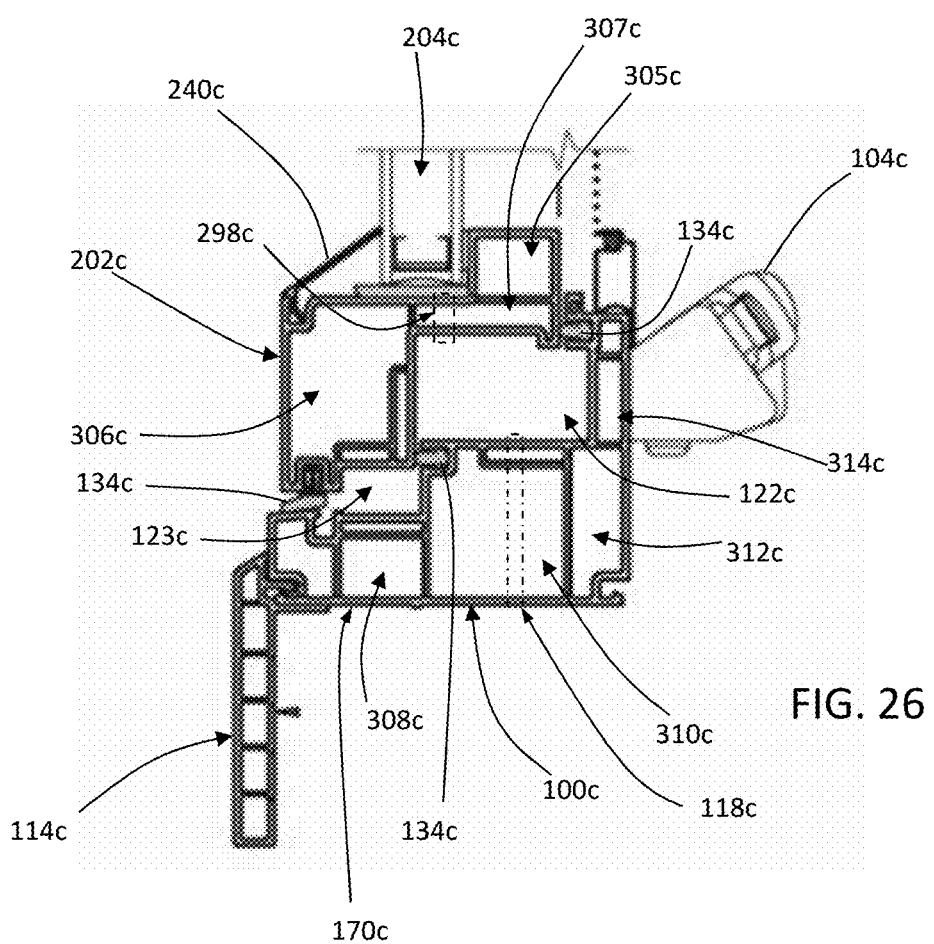
FIG. 26 is a cross sectional view of one form of prior art vinyl window scaffold and frame illustrating various chambers having open interiors.

Some windows such as Vinyl windows are made from extruded plastics or fiberglass. Vinyl windows typically comprise several structural walls with internally open chambers which in some instances are partially filled with insulation. In some embodiments these chambers are used to house portions of an exit conductor which may traverse along a length of a chamber. For example, FIG. 26 illustrates a cross sectional view of one form of scaffold and frame of a prior art vinyl window. Various portions of a scaffold assembly 202c and frame 100c have open interiors. For example, a scaffold assembly portion 202c comprises a first scaffold chamber 306c, a second scaffold chamber 307c, and a third scaffold chamber 305c. A frame portion 100c comprises a first frame chamber 308, a second frame chamber 310, a third frame chamber 312, and a fourth frame chamber 314. In a preferred embodiment, scaffold ports 298c and frame ports 118c extend into these chambers and provide access to them. Once entering a chamber, an exit conductor may travel along the length of a chamber to another point for exit while benefitting from the protection of the chamber and being hidden from view. Similarly, terminal joiners may be partially housed within these chambers for joining various portions of the exit conductor. Vinyl window forms may have many similar features as previously identified. Any one of these features may be included in singular form or plural form. Examples of common features on a vinyl window include; a frame portion 100c, a nailing fin 114c, a scaffold assembly 202c, a sealing gasket 134c, a glaze bead 240c, a glaze 204c, an operator 104c, a chest cavity 122c, an outer frame surface 170c, and a second chest cavity 123c.

Figure 39:
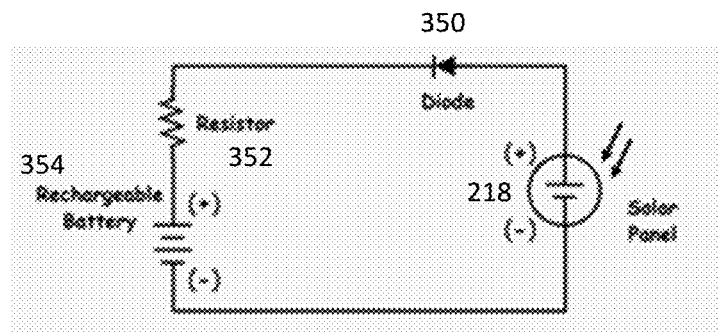
FIG. 39 is an electrical schematic view of one form of a solar circuit useable within a solar window.
Figure 40:
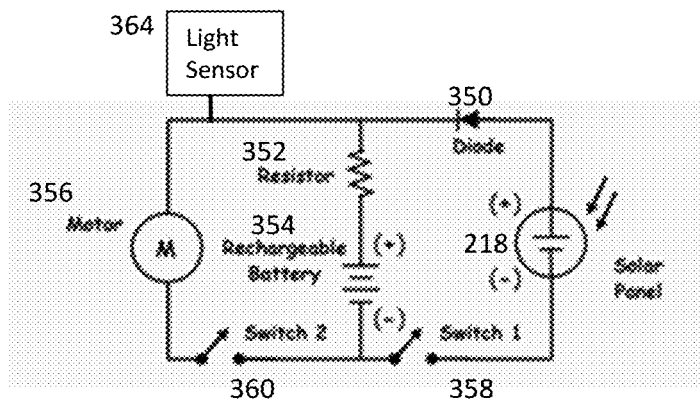
FIG. 40 is an electrical schematic view of one form of a solar circuit with integrated rechargeable battery and a motor powered by energy collected by the window's solar collector layer.
Figure 40B:
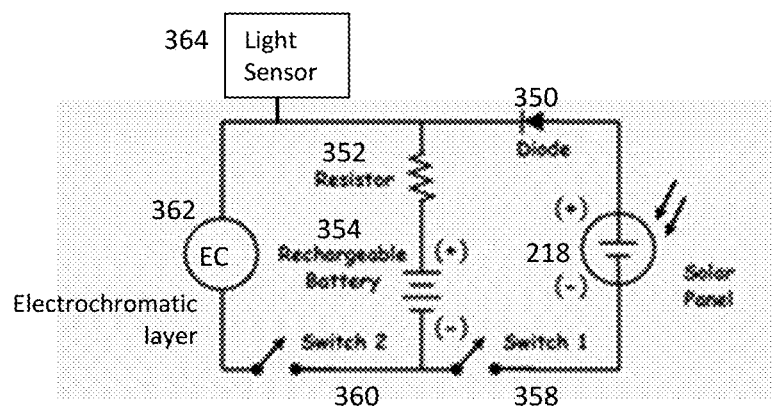
FIG. 40B is an electrical schematic view of one form of a solar circuit with integrated rechargeable battery and electrochromatic layer.

One form of a window's solar circuit is illustrated in FIG. 39. This common circuit comprises a diode 350 and a rechargeable battery 354. Light energy absorbed by a solar panel is converted to direct electrical current. Conductors carry the current through diode 350 and resistor 352 into rechargeable battery 354. Diode 350 prevents electrical current from reversing in the absence of light and moving back to solar cell. Resistor 352 moderates the flow of current from flowing too fast. A parallel circuit may be used to power accessory devices (FIG. 40). For example, a small motorized fan 356 may be connected and powered from battery 354. As an alternative, motor 356 may be used to operate a crank to open or close a sash, or operate the raising and lowering of a shade. Switches 358, 360 may be integrated in the circuits to charge battery 354 or run motor 356. In some embodiments the switches may be replaced with light sensors 364 such as photoresisters. For example, when light is powering a solar cell, a photoresister closes the circuit so the battery can be charged. Transparent solar collector layer electrical energy directed to motor 356 may alternatively be used to operate levels of one or more of: tint and opacity, of an electrochromatic layer 362 covering a pane. In some embodiments a light sensor 364 such as a photoresister is utilized to cause automatic adjustment of these levels depending on light levels. When light sensor 364 is placed outside, one or more of electrochromatic tint and opacity levels are adjusted to a predetermined amount based outdoor light levels. Alternatively, when light sensor 364 is placed inside a building, one or more of electrochromatic tint and opacity levels are adjusted to a predetermined amount based on indoor light levels. For example, a user may desire the windows to turn opaque when the inside lights are turned on thereby preventing persons outside from having a clear view of inside the building.

Figure 43:
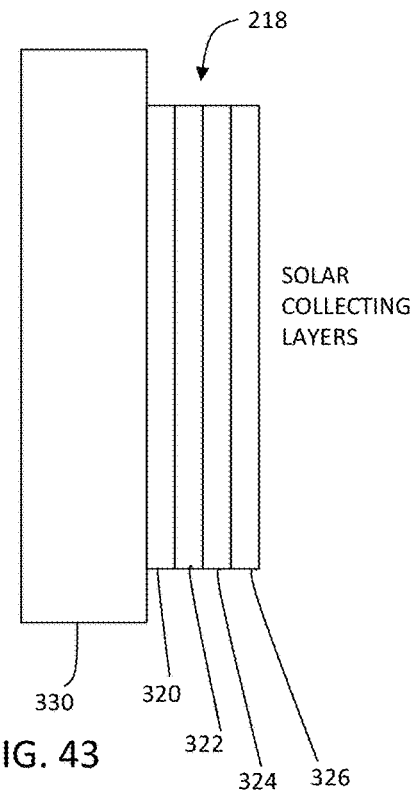
FIG. 43 illustrates an end view of a transparent solar collector comprising multiple layers on a broad surface of a pane.

FIG. 43 illustrates one embodiment of a transparent solar collector 218 formed of a plurality of layers of coatings each having specialized light responsive characteristics so as to capture a broad light range wavelength thereby increasing the light to energy conversion. In some embodiments, the coatings have a nano thickness. Illustrated here is first light sensitive coating 320, second light sensitive coating 322, third light sensitive coating 324, and fourth light sensitive coating 326. More or less coating layers may be used to optimize the capture of non-visible light versus cost of manufacturing. In this embodiment, the transparent solar collector is formed on broad surfaces of a second pane 330, however one skilled in the art will recognize that it could be formed on any one of the panes in a window preferably within an interior sealed space. Functional configurations disclosed herein for transporting power along an exit conductor from a transparent solar collector on a moveable sash is applied to providing power to an electrochromatic layer on the sash of an operable window. These principles apply to both casement style and sliding style windows.

Figure 44:
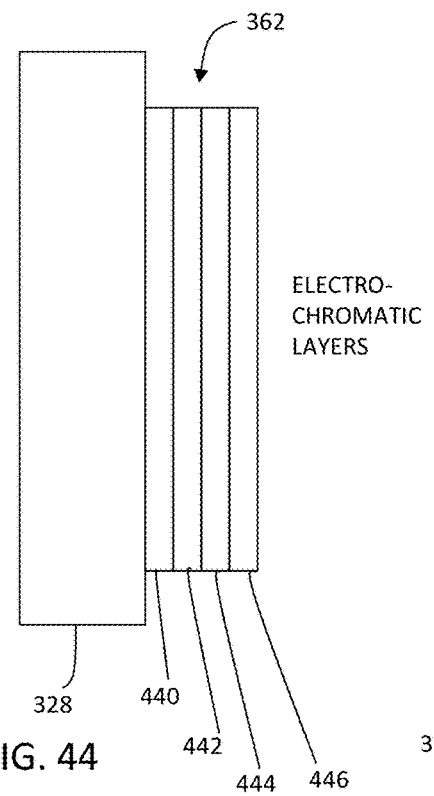
FIG. 44 illustrates an end view of a multiple layers of an electrochromatic coating on a broad surface of a pane.

Illustrated in FIG. 44 as just one example, electrochromatic coatings utilized on the broad surfaces of a first pane 328 preferably facing an internal space comprise a plurality of layers of a metal oxide. Ions move between the metal oxide layers when an electrical voltage is supplied resulting in a consequent change in tint level on the substrate. Here a plurality of metal oxide layers is illustrated as a first metal oxide layer 440, a second metal oxide layer 442, a third metal oxide layer 444, and a fourth metal oxide layer 446 although more or less layers may be used with layers separated to one or more different broad surfaces of panes of a window if so desired. Darkening or otherwise a change in tint and/or opacity may occur with automatic adjustments at dusk, dawn, and throughout the day. For example, an electrochromatic film may automatically adjust to opaque at night and return to transparent at dawn through the use of a photo sensor such as a photo resistor that senses ambient outdoor light. Similarly, the electrochromatic layers may be controlled by applications in response outdoor conditions or other user preferences.

As illustrated in FIG. 47, a control 384 system processes feedback from one or more sensors 380 that are integrated into the window assembly or located outdoors or elsewhere to process outdoor weather conditions and responsively adjust one or more of electrochromatic window tint and opacity to create a preferred lighting environment within one or more rooms of a building. Alternatively, an external power source 386 may be used to power the electrochromatic layers directly or indirectly through a battery.

In one form, control over one or more of opacity and tint of a window controls levels of glare and heat. Such control can result in a significant reduction of energy consumption typically required to heat the indoor space while concurrently blocking out a significant amount of UV light. In preferred embodiments, interior sealed spaces (i.e. 370-372) between panes of glass are filled with an inert gas such as argon. A dual pane configuration comprises a first interior sealed space 370 (between a first pane 328 and second pane 330). A triple pane configuration comprises a first interior sealed space 370 and a second interior sealed space 372 (between a second and third pane). A quadruple pane configuration comprises a first interior sealed space 370, a second interior sealed space 372, and a third interior sealed space 374 (between a third and fourth pane).

Illustrated in FIG. 48, internal layers of a triple pane or quadruple pane glaze (as shown) comprise an inner polymer suspended film (illustrated as thinner second pane 330 and third pane 332) to reduce weight and to keep the overall glaze thickness manageable while still dividing the internal space. The outer glass substrates (first pane 328, fourth pane 334) assist in protecting the thinner and more delicate internal suspended films. In preferred embodiments, Low-E coatings are applied to one or more broad surfaces (first broad surface 336, second broad surface 338, third broad surface 340, fourth broad surface 342) on substrates of the internal spaces (i.e. first interior sealed space 370, second interior sealed space 372, third interior sealed space 374). Similarly, in preferred embodiments and when present, the electrochromatic coating is applied to one or more inside facing pane broad surfaces such as one or more of the: first interior sealed space, and the second interior sealed space (if present), and the third interior sealed space (if present). As apparent to one skilled in the art, one or more of a first, second, third, fourth, fifth, and sixth broad surface of interior sealed spaces may be utilized for application for one or more of solar, electrochromatic, and low-E coatings.

Figure 45:
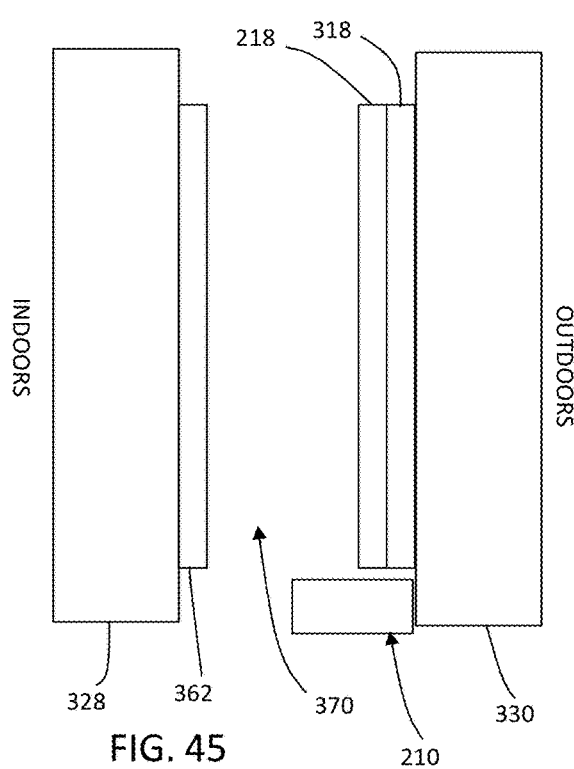
FIG. 45 depicts an end view of one configuration of a window comprising both an electrochromatic layer, a transparent solar collector layer, and a low-E coating layer in an internal space between two panes.
Figure 46:
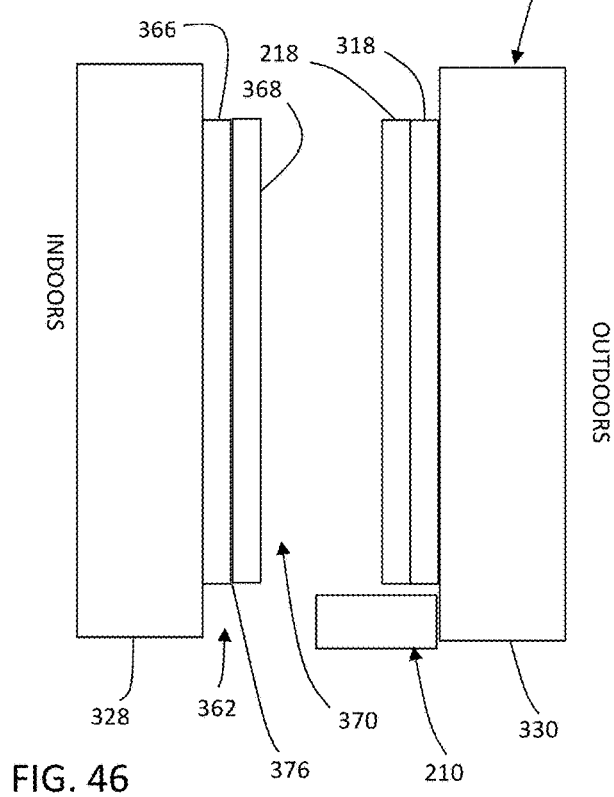
FIG. 46 depicts an end view of one configuration of a window comprising both an electrochromatic layer, a transparent solar collector layer, and a low-E layer whereby the electrochromatic layer comprises both an electrochromatic tint layer and an electrochromatic opacity layer.

As illustrated in FIG. 45-47, a transparent solar collector 218 is positioned on broad surfaces of a glaze closer to the outdoor side of the window whereas electrochromatic layers 362 are positioned closer to the indoor side of the window. Such arrangement facilitates optimal energy collection from the transparent solar collector when tint or opacity is from the electrochromatic layer is present. In some embodiments, a separator layer 376 (placed between adjacent layers) is utilized to prevent interference between one or more of: adjacent electrochromatic layers, adjacent solar collector layers, and adjacent electrochromatic/solar collector layers. The separator layer 376 (FIG. 46) is typically transparent and non-conductive. In some cases, at least one pane is laminated 378 for improved strength as illustrated in FIG. 46.

As further illustrated in FIG. 47, in some embodiments, electrochromatic 362 coatings or films are at least partially powered by energy transferred from said generally transparent solar collector portion 218 which may send power generated to battery 382 for temporary storage and on demand use or directly to a control 384 that controls distribution to an electrochromatic layer 362 which may comprise one or more of an electrochromatic tint 366 and an electrochromatic opacity 368 layer.

FIG. 48B illustrates one embodiment of a first glaze 204K construction comprising two or more panes (first-fourth 328K-334K respectively), with spacers therebetween the panes to seal and create an internal volume 230K therebetween with an inert gas therein. Disposed on the glaze is a battery 382K, and a wireless control 448K. One or more transparent solar collector layers 218K are disposed on at least one of the panes as well as one or more electrochromatic layers 362K which is powered by energy generated by the solar collector layer. Sensors 380K may be used to sense external ambient or outdoor lighting conditions. In this embodiment, this glaze is self contained, and self powered requiring no external wiring.

In some embodiments, one or more electrochromatic layers 362 in a solar collecting window is powered by a wireless energy source as illustrated in FIG. 46. Here electrochromatic layers in a solar collecting window are powered by wireless energy collected from a wireless power receiver 390. For example, one type of wireless receiver is configured for magnetic resonance and others by induction. Conversely, in some embodiments, a solar collecting window is electrically coupled with a wireless power transmitter 388 to wirelessly transfer power generated from the solar collecting window to be used elsewhere as a power source as also illustrated in FIG. 46.

A preferred method for constructing an operable sliding window utilizing solar collecting glass is now described. Construct a window frame 100b of a predetermined shape and size comprising a header 106b, a sill 108b, and a first jamb 110b and a second jamb 112b. Construct a solar collecting first sash 200 and second sash 201 by constructing a transparent solar collecting first glaze 204b and a second glaze 205b utilizing at least one pane 228 of a generally transparent glass or polymer substrate comprising a solar collector 218 formed on a face 226 of pane 228. Electrically coupling a positive and negative solar cell terminal 220 with said solar collector 218. Construct two scaffold assemblies 202b capable of sliding window movement within window frame 100b from a first rail 236b, a second rail 237b, a first stile 238b, and a second stile 239b wherein each stile and rail comprises a glaze cup 248b for sealing a solar energy producing glaze 204 therein.

Place each transparent solar collecting glaze 204 into a rabbet 250b of each scaffold assembly 202 while electrically coupling said elongate contact terminals 300b, 302b with solar cell terminals 220 on glaze 204. Fixing the glaze 204 in rabbet 250 with a glaze bead 240 or similar fixation method.

Form complementing sliding surfaces between window frame 100b and scaffold assemblies 202b (a liner material therebetween may be substituted) by forming a pair of spaced elongated slide bosses (140b-146b) on an internal surface of a sill 108b and header 106b. Space slide bosses (140b-146b) such that at least one sash (200b,205b) can be slid behind the other. Form an elongated scaffold guide groove (294b-296b) in opposed external surfaces of each scaffold assembly 202. Form a scaffold port 298b in one of said rails extending between rabbet 250b, and a base surface 304 defining scaffold guide groove 294b. Form a pair of elongate contact terminals (300b, 302b) (one positive and one negative) for conducting electrical current along substantially the entire length of a base surface 304b of elongated scaffold guide grooves 294b.

Form a first frame port 118b and a second frame port 119b extending between an outside frame surface 170b of a window frame and primary guide surfaces 154b, 156b of window frame. Extend a frame portion of an exit conductor 124 through each frame port. Form frame terminals 150b, 152b on a surface of slide boss 140b, 142b in sliding contact opposition with elongate contact terminals 300b, 302b formed on the surface of the elongate scaffold guide grooves 294b, 296b. Establish electrical communication between frame terminals 150, 152b with exit conductor and exit through frame port to one of the following; to its final electrical destination such as an inverter or solar system of a home, to a joiner located in the outer wall of the frame where it may be joined with other solar circuits, along an extension channel, or to an access window or battery cavity where it can be used to charge batteries or provide electrical power to accessories.

A preferred method for constructing an operable casement window utilizing solar collecting glass is now described. Construct a frame of a predetermined shape and size comprising a header, sill, and a pair of opposing jambs. Construct a transparent solar collecting glaze utilizing at least one pane of a substrate and comprising an edge mounted or substrate surface mounted solar cell. Couple a positive and negative solar terminal with the solar cell. Construct a scaffold assembly sized and shaped for fit within the frame and configured for pivot movement away from the frame from a plurality of rails and stiles. Form on the rails and stiles a rabbet and in some embodiments an adjunct recess wherein the rabbets define a glaze cup. Install weather stripping to maintain a seal between the sash and frame when closed.

Form a scaffold port in one of the rails or stiles (preferably the rail or stile that remains closest to the frame when opened) extending between the rabbet or adjunct recess, and an outer surface of the scaffold assembly. The scaffold port is preferably placed to open to a chest cavity (if present) between the frame and scaffold.

Secure a scaffold portion of an exit conductor in the scaffold port exposing the lead end of the joiner in the rabbet. Place the transparent solar collecting glaze in the prepared glazed cup. Electrically couple the polar solar terminals with the sash lead of the scaffold portion of an exit conductor using a joiner (this may occur as incidence of the glaze being placed in the glaze cup). Fix the glaze with a glaze bead or other fixation method such as plastic welding.

Choose a location for the frame port on the frame preferably near the exit of the scaffold port. Form a frame port at the chosen location between an outside surface of the window frame and an inside surface of the window frame. If joiners or wire clamps or grommets will be used at either end of the bridge portion, create the required cavities to house or fasten them in the scaffold or frame. In some forms the joiner may be releaseable (i.e. a sash port plug) for rapid assembly or separation of the sash from the frame. Continue to route the bridge portion of the exit conductor through the chest cavity and into the frame port or connect utilizing a joiner. Form the bridge portion into a predetermined shape for housing within the chest cavity to accommodate sash opening and closing.

Extend a frame portion of an exit conductor through the entry of the frame port. Coupled to the frame portion of the exit conductor, form contact terminals on a surface of a wall defining the elongate guide boss that is in contact opposition with the elongate contact terminals formed on the surface of the elongate scaffold guide grooves. Extend the exit conductor from the exit of the frame port to one of the following; to its final electrical destination such as an inverter or solar system of a home, to a joiner located in the outer wall of the frame where it may be joined with other solar circuits, along an extension channel, or to an access window or battery cavity where it can be used to charge batteries or provide electrical power to accessories.

Mount hinge hardware to the sash and frame. Mount an operator crank mechanism to the sash and frame for opening and closing the sash.

The foregoing invention has been described in accordance with the relevant legal standards, thus the description is exemplary rather than limiting in nature. Variations and modifications to the disclosed embodiment may become apparent to those skilled in the art and fall within the scope of the invention.

The invention claimed is:

1. An operational solar collecting window comprising:
a first sash;
said first sash comprising one or more panes with each pane having opposed broad surfaces;
said one or more panes of said first sash comprising a generally transparent solar collector joined to at least one of said opposed broad surfaces an electrical current when exposed to light;
said first sash comprising a scaffold assembly encompassing said generally transparent solar collector;
an exit conductor;
said exit conductor having a sash lead electrically coupled with said generally transparent solar collector;
said exit conductor having a functional lead operable to electrical couple with a solar system within a building;
a scaffold port extending through said scaffold assembly and operable to provide passage of a conductor through said scaffold;
whereas a portion of said exit conductor resides in said scaffold port;
a bridge portion of said exit conductor;
a window frame operable to mount within the wall of a building structure;
said bridge portion operable to conduct electrical current through said exit conductor from said first sash to said window frame;
said first sash operational by one of: sliding within said window frame and pivoting from said window frame; and
wherein said first sash further comprises at least one electrochromatic coating joined on one of said opposed broad surfaces of said one or more panes.

2. The operational solar collecting window of claim 1 further comprising:
a second sash;
said second sash comprising one or more panes having opposed broad surfaces;
said one or more panes of said second sash comprising a generally transparent solar collector joined to at least one of said opposed broad surfaces and operable to produce an electrical current when exposed to light.

3. The operational solar collecting window of claim 2 whereas said second sash slides within said window frame.

4. The operational solar collecting window of claim 1 whereas said generally transparent solar collector further comprises:
 a first light sensitive coating;
 a second light sensitive coating;
 whereas said first light sensitive coating and said second light sensitive coating have a different light responsive characteristic operable to cooperatively capture a broader band range of light.

5. The operational solar collecting window of claim 1 whereas said at least one electrochromatic coating on one of said opposed broad surfaces of said one or more panes further comprises:
 a first metal oxide layer;
 a second metal oxide layer;
 whereas said first metal oxide layer and said second metal oxide layer are independently activated to vary tint level.

6. The operational solar collecting window of claim 1 whereas:
 said one or more panes comprises a first pane operable to placement adjacent outdoors and a second pane operable to placement adjacent indoors;
 a first interior sealed space between said first pane and said second pane;
 said electrochromatic coating joined on a broad surface of said first pane within said first interior sealed space; and whereby
 said generally transparent solar collector is joined on a broad surface of said second pane within said first interior sealed space.

7. The operational solar collecting window of claim 6 wherein said one or more panes further comprises a Low-E layer joined to at least one broad surface of at least one of the panes.

8. The operational solar collecting window of claim 1 whereas:
 said one or more panes comprises a first pane operable to placement adjacent the outdoors, a third pane operable to placement adjacent the indoors, and a second pane positioned between said first pane and said third pane;
 a first interior sealed space between said first pane and said second pane;
 a second interior sealed space between said second pane and said third pane;
 wherein said at least one electrochromatic coating is joined to at least one of said broad surfaces within at least one of said first interior sealed space and said second interior sealed space;
 and wherein said generally transparent solar collector is joined to at least one of said broad surfaces within a least one of said first interior sealed space and said second interior sealed space.

9. An operational solar collecting window comprising:
 a first sash;
 said first sash comprising one or more panes with each pane having opposed broad surfaces;
 said one or more panes comprising a generally transparent solar collector joined to at least one of said opposed broad surfaces and operable to produce an electrical current when exposed to light;
 said first sash comprising a scaffold assembly encompassing said generally transparent solar collector;
 a window frame operable to mount within the wall of a building structure;
 said first sash movably fixed to said window frame;
 said first sash operational by one of: sliding within said window frame and pivoting from said window frame; and
 wherein said first sash further comprises at least one electrochromatic coating joined on one of said opposed broad surfaces of said one or more panes.

10. The operational solar collecting window of claim 9 whereas said at least one electrochromatic coating further comprises at least one electrochromatic tint layer and at least one electrochromatic opacity layer.

11. The operational solar collecting window of claim 9 further comprising:
 one or more sensors integrated into the window assembly;
 a control responsive to said one or more sensors and operable to control activation of said at least one electrochromatic coating associated with at least one of window opacity and window tint.

12. The operational solar collecting window of claim 9 wherein said at least one electrochromatic coating is powered by an external power source.

13. The operational solar collecting window of claim 9 wherein said at least one electrochromatic coating is powered by energy generated from said generally transparent solar collector.

14. The operational solar collecting window of claim 9 further comprising:
 a battery;
 said battery operable to charge from energy from said generally transparent solar collector;
 and whereby said at least one electrochromatic coating is powered by said battery.

15. The operational solar collecting window of claim 9 further comprising:
 a wireless power receiver;
 a control;
 whereas energy captured by said wireless power receiver is directed by said control to power an electrochromatic coating on said one or more panes.

16. A self-contained and self-powered electrochromatic solar collecting glaze comprising:
 a first pane having a pair of opposed broad surfaces;
 a second pane having a pair of opposed broad surfaces;
 a spacer positioned between said first pane and said second pane;
 an internal volume defined by said first pane, said second pane, and said spacer;
 at least one electrochromatic layer joined to one of said first pane and said second pane in said internal volume;
 at least one transparent solar collector joined to said one of said first pane and said second pane in said internal volume;
 a battery mounted to the glaze;
 said at least one transparent solar collector operable to provide electrical energy to said battery; and
 whereas said battery powers said at least one electrochromatic layer.

17. The self-contained and self-powered electrochromatic solar collecting glaze of claim 16 further comprising:
 a wireless control operable to control at least one of tint and opacity of said at least one electrochromatic layer.

18. The self-contained and self-powered electrochromatic solar collecting glaze of claim 16 further comprising:

at least one sensor operable to sense at least one of external ambient lighting and outdoor lighting conditions.

19. The self-contained and self-powered electrochromatic solar collecting glaze of claim 16 further comprising:
a wireless power receiver on said glaze;
a control on said glaze;
whereas said wireless power receiver is operable to direct captured power to said control to power said at least one electrochromatic layer on said one or more panes.

20. The self-contained and self-powered electrochromatic solar collecting glaze of claim 16 whereby power generated from said at least one transparent solar collector is operable to power at least one of tint and opacity of said at least one electrochromatic layer of the glaze.

* * * * *